United States Patent
Guo et al.

(10) Patent No.: US 12,453,094 B2
(45) Date of Patent: Oct. 21, 2025

(54) METHOD FOR REMOVING SACRIFICIAL LAYERS OF A STACK OF A THREE-DIMENSIONAL SEMICONDUCTOR STRUCTURE IN TWO STEPS

(71) Applicant: Yangtze Memory Technologies Co., Ltd., Hubei (CN)

(72) Inventors: Zhen Guo, Hubei (CN); Wei Xu, Hubei (CN); ZhiPeng Wu, Hubei (CN); XiaoFen Zheng, Hubei (CN); Yuan Yuan, Hubei (CN); Lei Li, Hubei (CN); Lei Xue, Hubei (CN); ZongLiang Huo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 497 days.

(21) Appl. No.: 18/083,640

(22) Filed: Dec. 19, 2022

(65) Prior Publication Data

US 2024/0172437 A1    May 23, 2024

(30) Foreign Application Priority Data

Nov. 18, 2022   (CN) .......................... 202211448971.3

(51) Int. Cl.
  *H10B 43/27*     (2023.01)
  *H10B 41/27*     (2023.01)

(52) U.S. Cl.
  CPC ............. *H10B 43/27* (2023.02); *H10B 41/27* (2023.02)

(58) Field of Classification Search
  CPC ......... H10B 43/27; H10B 41/27; H10B 43/50
  See application file for complete search history.

(56) References Cited

U.S. PATENT DOCUMENTS

| | | | |
|---|---|---|---|
| 2010/0133599 A1* | 6/2010 | Chae ...................... | H10B 43/10 257/315 |
| 2021/0050364 A1* | 2/2021 | Tapias ............... | H01L 21/02164 |

* cited by examiner

*Primary Examiner* — Davienne N Monbleau
*Assistant Examiner* — Emily Nicole Farmer
(74) *Attorney, Agent, or Firm* — Oblon, McClelland, Maier &Neustadt, L.L.P.

(57) ABSTRACT

A method includes forming a stack of alternating insulating layers and sacrificial layers over a substrate; forming a trench through the stack to uncover the substrate to expose lateral sides of the insulating layers and the sacrificial layers, the trench extending from a core area to a stair step area of the stack; forming a liner to cover the exposed lateral sides; removing the liner in the trenches within a first area of the core area and the stair step area to expose the lateral sides of the sacrificial layers of the stack within the first area; removing the sacrificial layers within the first area; removing the liner in the trenches within a second area of the core area and the stair step area to expose the lateral sides of the sacrificial layers of the stack within the second area; and removing the sacrificial layers within the second area.

20 Claims, 18 Drawing Sheets

METHOD FOR REMOVING SACRIFICIAL LAYERS OF A STACK OF A THREE-DIMENSIONAL SEMICONDUCTOR STRUCTURE IN TWO STEPS

CROSS-REFERENCE

This application claims the priority to Chinese Application No. 202211448971.3, filed on Nov. 18, 2022. The entire disclosure of the prior application is hereby incorporated by reference in its entirety.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit. A three-dimensional (3D) NAND memory device is an exemplary device of stacking multiple planes of memory cells to achieve greater storage capacity, and to achieve lower costs per bit. The 3D NAND memory device can include a stack of alternating insulating layers and word line layers over a substrate and a trench.

SUMMARY

According to an aspect of the present disclosure, a method of manufacturing a semiconductor structure is provided. For example, the method can include forming a stack of alternating insulating layers and sacrificial layers over a substrate. The stack can include a core area and a stair step area. The method can also include forming one or more trenches through the insulating layers and the sacrificial layers of the stack down to uncover the substrate to expose lateral sides of the insulating layers and the sacrificial layers. The trenches can extend from the core area to the stair step area. The method can also include forming a liner to cover the exposed lateral sides of the insulating layers and the sacrificial layers in the trenches within the core area and the stair step area, removing the liner in the trenches within a first area of the core area and the stair step area to expose the lateral sides of the sacrificial layers of the stack within the first area, removing the sacrificial layers of the stack within the first area, removing the liner in the trenches within a second area of the core area and the stair step area to expose the lateral sides of the sacrificial layers of the stack within the second area, and removing the sacrificial layers of the stack within the second area. For example, the first area is the core area. As another example, the first area is the stair step area.

In an embodiment, the liner can be formed in an atomic layer deposition (ALD) process. In another embodiment, the liner can include polysilicon. In some embodiments, the method can further include filling with a conductive material spaces that are formed after the sacrificial layers of the stack are removed.

In an embodiment, the method can further include, prior to removing the liner in the trenches within the first area, filling the trenches with a trench filler material, and removing the trench filler material filled in the trenches within the first area. In another embodiment, the method can further includes, prior to removing the trench filler material filled in the trenches within the first area, covering the trench filler material filled in the trenches within the second area, with the trench filler material in the trenches within the first area uncovered. For example, the trench filler material can be a photo resist material, and removing the trench filler material can include performing a photolithography process to develop the photo resist material in the trenches within the first area and removing the developed photo resist material. As another example, the trench filler material can include carbon having a SiON layer on a top thereof, the trench filler material filled in the trenches within the second area can be covered by a photo resist layer, and removing the trench filler material can include performing an etch process on the photo resist layer and the trench filler material such that the entire trench filler material filled in the trenches within the first is etched away and the trench filler material in the trenches within the second area still exists. In an embodiment, the etch process can be a dry etch process.

In an embodiment, the method can further include removing the trench filler material filled in the trenches within the second area. For example, removing the trench filler material filled in the trenches within the second area can be performed prior to removing the sacrificial layers of the stack within the first area. As another example, removing the trench filler material filled in the trenches within the second area can be performed after the sacrificial layers of the stack within the first area are removed.

In an embodiment, the method can further include forming one or more channel structures through the insulating layers and the sacrificial layers of the stack within the core area into the substrate. For example, the one or more channel structures can be formed prior to forming the trenches.

In an embodiment, the method can further include prior to forming the liner, preforming an oxidization process on the uncovered substrate to form an oxidation layer.

In an embodiment, the liner can be etch resistant to an etchant that is used to remove the sacrificial layers. For example, the etchant can include sulfuric acid ($H_2SO_4$). As another example, the etchant can include tetramethyl ammonium hydroxide (TMAH).

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

FIGS. 1A-9A are cross-sectional views of various intermediate steps of the method of manufacturing the 3D semiconductor structure along a cut line AA' shown in FIGS. 1-9, respectively, in accordance with some embodiments of the present disclosure.

FIGS. 1B-9B are cross-sectional views of various intermediate steps of the method of manufacturing the 3D semiconductor structure along a cut line BB' shown in FIGS. 1-9, respectively, in accordance with some embodiments of the present disclosure.

FIGS. 10A-17A are cross-sectional views of various intermediate steps of the method of manufacturing the 3D semiconductor structure along a cut line AA' shown in FIGS. 10-17, respectively, in accordance with some embodiments of the present disclosure.

FIGS. 10B-17B are cross-sectional views of various intermediate steps of the method of manufacturing the 3D semiconductor structure along a cut line BB' shown in FIGS. 10-17, respectively, in accordance with some embodiments of the present disclosure.

DETAILED DESCRIPTION

Figure 1:
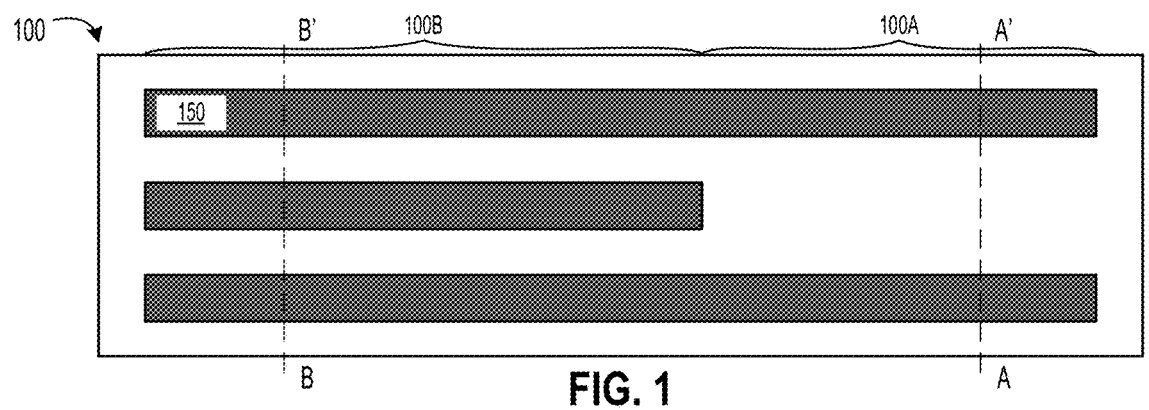
FIGS. 1-9 are top views of various intermediate steps of an exemplary method of manufacturing an exemplary 3D semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. As used herein, the range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., .+−.10%, .+−.20%, or .+−.30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

A 3D semiconductor structure that is used to form a 3D NAND memory device includes a stack of alternating sacrificial layers and insulating layers that extend from a stair step area to a core area, and the sacrificial layers within the stair step area and the core area are removed in two individual steps, respectively, via one or more gate line trenches that are through the sacrificial layers and the insulating layers of the stack and extend from the stair step area to the core area. For example, when the sacrificial layers within the stair step area are removed a trench filler material, e.g., polysilicon, is filled in the gate line trenches within the core area to protect the sacrificial layers within the core area from removal; and when the sacrificial layers within the core area are removed the gate line trenches within the stair step area are filled with carbon, for example, to prevent the sacrificial layers that are remained within the stair step area from collapse. As the gate line trench has a high aspect ratio, one or more seams will be formed in a central region of the polysilicon. Accordingly, when sulfuric acid ($H_2SO_4$) that is used to remove the sacrificial layers is removing the sacrificial layers within the stair step area, the sulfuric acid will be likely to flow from the stair step area through the seams to the core area to remove a portion of the sacrificial layers within the core area, even though the gate line trench within the core area is filled with the polysilicon.

FIGS. 1-9 are top views of various intermediate steps of an exemplary method of manufacturing an exemplary 3D semiconductor structure 100 in accordance with some embodiments of the present disclosure. The method can be used to remove sacrificial layers of a stack of the 3D semiconductor structure 100 in two steps. The 3D semiconductor structure 100 can be used to manufacture a 3D NAND memory device. In the example embodiment, the 3D semiconductor structure 100 includes a stair step area 100A and a core area 100B. FIGS. 1A-9A are cross-sectional views of the various intermediate steps of the method of manufacturing the exemplary 3D semiconductor structure 100 corresponding to a cross-section along a cut line AA' within the stair step area 100A shown in FIGS. 1-9, respectively. FIGS. 1B-9B are cross-sectional views of the various intermediate steps of the method of manufacturing the exemplary 3D semiconductor structure 100 corresponding to a cross-section along a cut line BB' within the core area 100B shown in FIGS. 1-9, respectively.

Figure 1A:
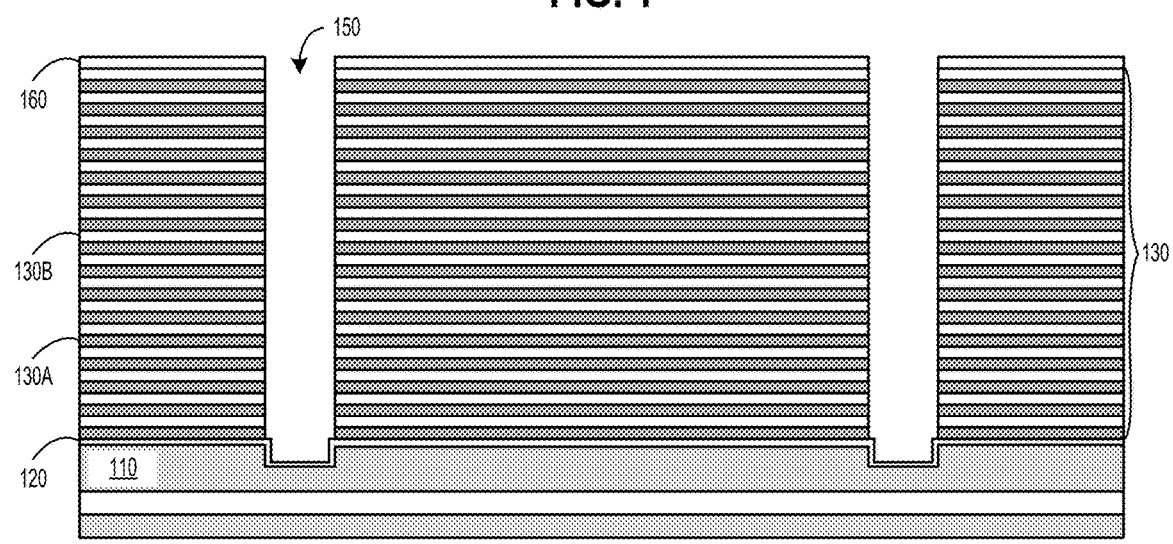
Figure 1B:
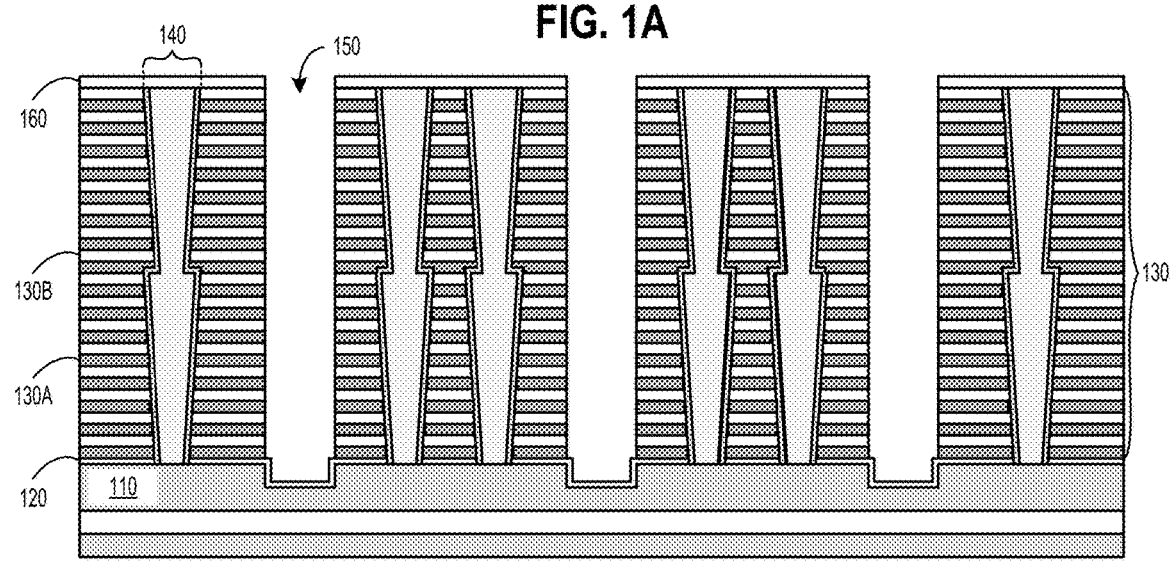

As shown in FIGS. 1, 1A and 1B, a substrate 110 is provided. The substrate 110 can be any suitable semiconductor substrate having any suitable semiconductor materials, such as monocrystalline, polycrystalline or single crystalline semiconductors. For example, the substrate 110 can include silicon, silicon germanium (SiGe), germanium (Ge), gallium arsenide (GaAs), silicon on insulator (SOI), germanium on insulator (GOI), gallium nitride, silicon carbide, III-V compound, or any combinations thereof. An isolation layer 120 can be formed over the substrate 110. In an embodiment, the isolation layer 120 can be made of oxide, e.g., silicon oxide, or nitride, e.g., silicon oxynitride or silicon nitride. The isolation layer (or oxidation layer) 120 can be formed by any suitable deposition process, such as a chemical vapor deposition (CVD) process, a physical vapor deposition (PVD) process, an atomic layer deposition (ALD) process, an e-beam evaporation process, a sputtering process, a diffusion process, or any combination thereof.

A stack 130 of alternating sacrificial layers 130A and insulating layers 130B can be formed over the isolation layer 120. The stack 130 can extend in a lateral direction parallel to a top surface of the substrate 110, while the sacrificial layers 130A and the insulating layers 130B can alternate in a vertical direction perpendicular to the lateral direction. The sacrificial layers 130A can be the same or different from each other in thickness, ranging from 10-500 nm, preferably about 35 nm. The insulating layers 130B can also be the same or different from each other in thickness, ranging from 10-500 nm, preferably about 25 nm. It should be noted that the number of the sacrificial layers 130A and the insulating layers 130B shown in FIGS. 1A and 1B is for illustration only and that any suitable number of the sacrificial layers 130A and the insulating layers 130B can be included in the stack 130. The sacrificial layers 130A can include silicon oxide, silicon nitride or polysilicon. The insulating layers 130B can include dielectric materials, such as silicon oxide, silicon nitride, silicon oxynitride, or any combination thereof. In some embodiments, the insulating layers 130B can also include high-k dielectric materials, such as hafnium oxide, zirconium oxide, aluminum oxide, tantalum oxide, lanthanum oxide, or any combination thereof.

One or more channel structures 140 can be formed in the stack 130 through the sacrificial layers 130A and the insulating layers 130B into the substrate 110, as shown in FIG. 1B. In an embodiment, each of the channel structures 140 can be in the shape of a cylinder or a pillar, and include a high-k layer, a block layer surrounded by the high-k layer, a charge trapping layer (or a storage layer) surrounded by the block layer, a tunneling layer surrounded by the charge trapping layer, a channel layer surrounded by the tunneling layer, and a core filler layer surrounded by the channel layer (not shown), which extend through the sacrificial layers 130A and the insulating layer 130B of the stack 130, and a channel contact (not shown) formed above the core filler layer and being in contact with the channel layer. In some embodiments, the channel layer can include silicon, such as amorphous silicon, polysilicon, or single crystalline silicon, the tunneling layer can include silicon oxide, silicon nitride, or any combination thereof, the blocking layer can include silicon oxide, silicon nitride, high-k dielectrics, or any combination thereof, and the charge trapping layer can include silicon nitride, silicon oxynitride, silicon, or any combination thereof. In an embodiment, the tunneling layer, the charge trapping layer and the blocking layer, collectively referred to as a memory film, can include ONO dielectrics (silicon Oxide-silicon Nitride-silicon Oxide). The channel structures 140 can be formed as follows: one or more channel openings (not shown) are formed subsequently by a combination of a photolithography process and an etching process to extend through the sacrificial layers 130A and the insulating layer 130B of the stack 130 down to the substrate 110; and the high-k layer, the block layer, the charge trapping layer, the tunneling layer, the channel layer, the core filler layer and the channel contact can be formed within the channel openings subsequently.

One or more trenches (or gate line (GL) trenches) 150 can be formed within the stack 130 to divide the semiconductor structure 100 into a plurality of semiconductor fingers. In an embodiment, a tetraethyl orthosilicate (TEOS) hard mask (not shown) can be deposited over the stack 130 in a CVD process, a photoresist layer (not shown) can be applied over the TEOS layer and is patterned corresponding to the trench locations within the stack 130, and the stack 130 with the TEOS hard mask formed thereover can then be etched, whereby the trenches 150 can be formed within the stack 130 to uncover the substrate 110 and lateral sides of the sacrificial layers 130A and the insulating layers 130B of the stack 130 are exposed.

In an embodiment, the sacrificial layers 130A of the stack 130 will be removed eventually and replaced with a conductive material, e.g., tungsten (W) to form word line layers of the 3D semiconductor structure 100. In some embodiments, tungsten (W) can be deposited using a CVD or ALD process, with tungsten hexafluoride ($WF_6$) included in the reaction gas for the CVD or ALD process as the source of tungsten (W). In order to prevent $WF_6$, from reacting with the polysilicon substrate 110, after the formation of the trenches 150 an oxidization process is performed on the uncovered substrate 110 to form an oxide layer, e.g., the isolation layer 120.

A dielectric layer 160 can be formed over the stack 130 and the channel structures 140. In an embodiment, the dielectric layer 160 can be made of a variety of materials in different examples, such as SiO, SiC, SiN, SiCN, SiON, or the like.

Figure 2:
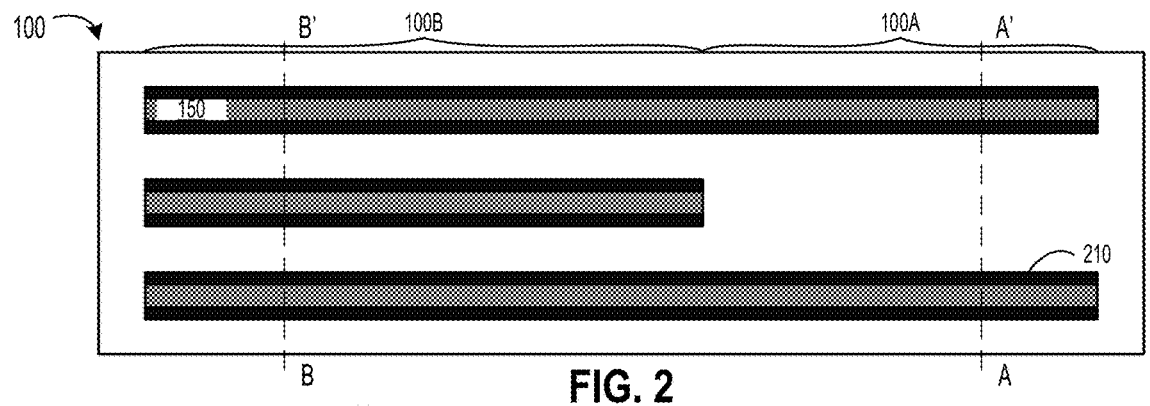
Figure 2A:
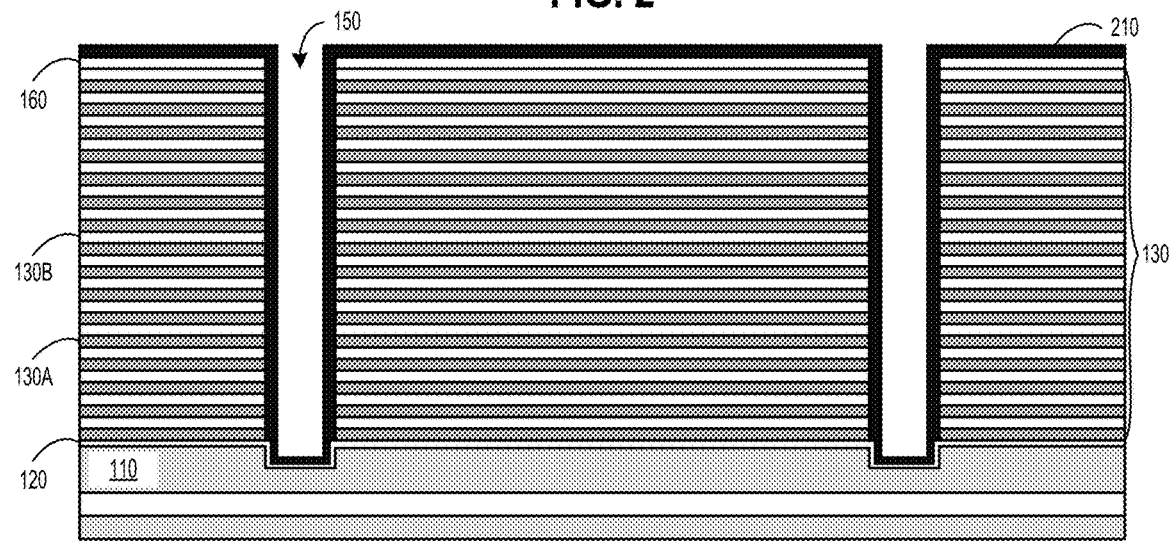
Figure 2B:
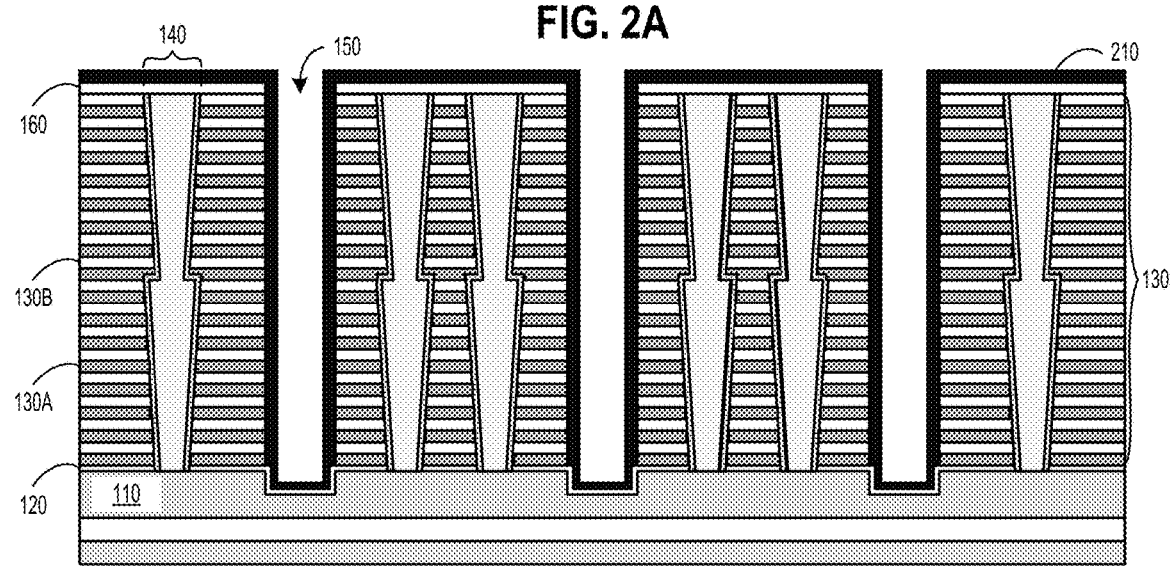

As shown in FIGS. 2, 2A and 2B, a liner 210 can be formed on the dielectric layer 160 and lateral and bottom surfaces of each of the trenches 150. For example, the liner 210 can include materials that are resistant to sulfuric acid ($H_2SO_4$) or tetramethyl ammonium hydroxide (TMAH), for example, which are used to remove the sacrificial layers 130A in subsequent steps. For example, the liner 210 can include polysilicon, tungsten, or other suitable materials. In some embodiments, the liner 210 can be formed by depositing a liner material on the dielectric layer 160 and the lateral and bottom surfaces of each of the trenches 150 in a deposition process, such as an ALD process, a CVD process, a plasma-enhanced CVD (PECVD) process, or the like. In the example embodiment, the liner 210 is formed in the ALD process. The ALD process is often performed at a low temperature, and can provide ultra-thin nano-layers in a precise manner on the substrate 110. The liner 210 including the nano-layers formed with the ALD process can be conformal and seamless. As a result, the exposed lateral sides of the sacrificial layers 130A and the insulating layers 130B of the stack 130 can be covered and sealed by the liner 210 tightly. The liner 210 can also be a sacrificial layer where it will be etched away during subsequent etch processes in order for the sacrificial layers 130A of the stack 130 to be removed.

Figure 3:
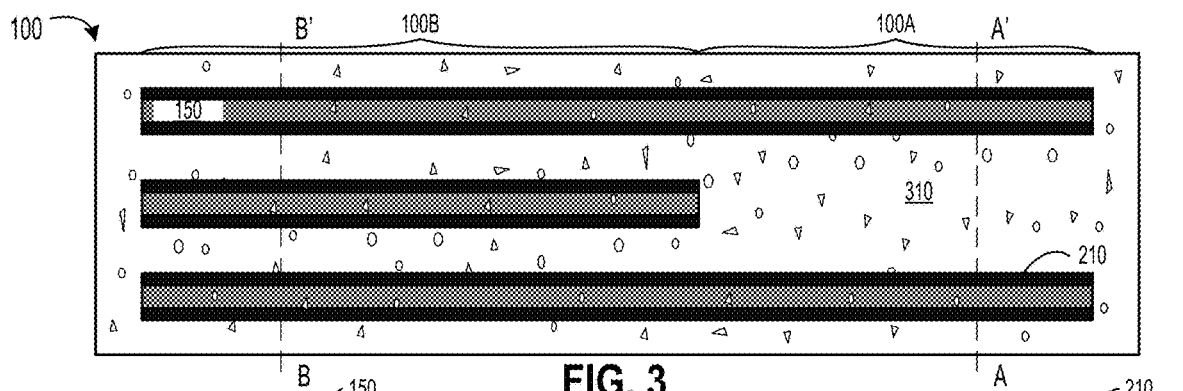
Figure 3A:
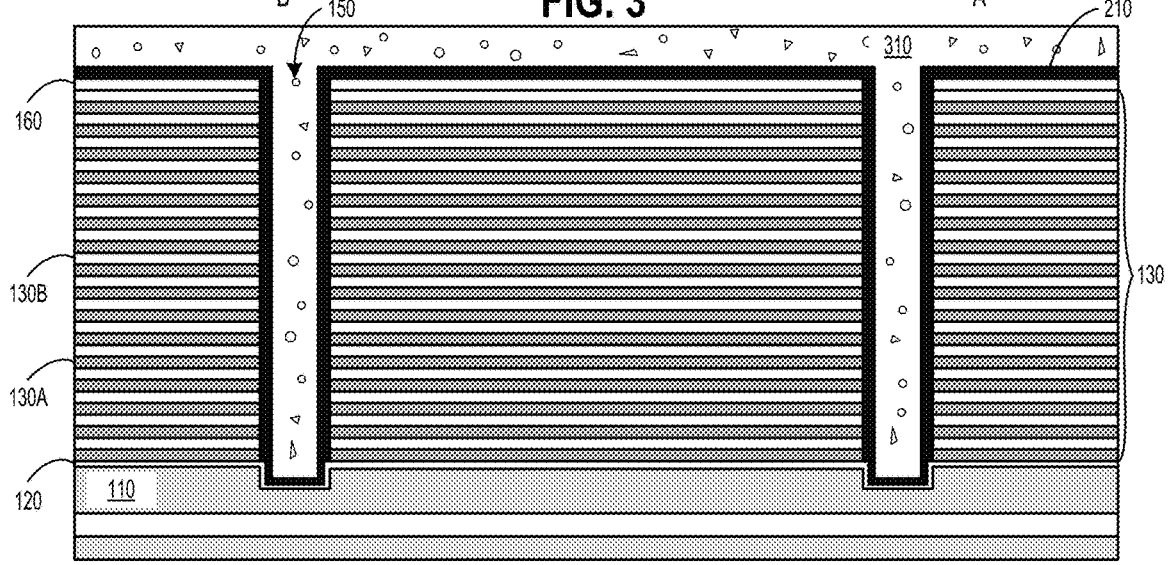
Figure 3B:
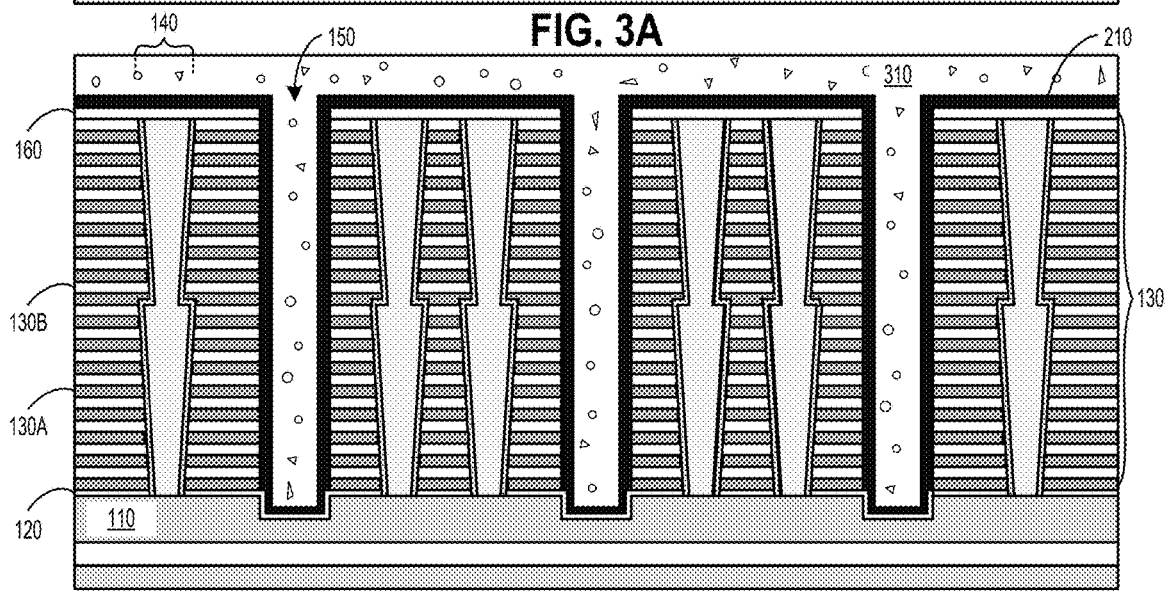

As shown in FIGS. 3, 3A and 3B, the semiconductor structure 100 is coated with a trench filler material. For example, a photo resist layer 310, positive or negative, can be formed to fill the trenches 150 and cover the liner 210.

Figure 4:
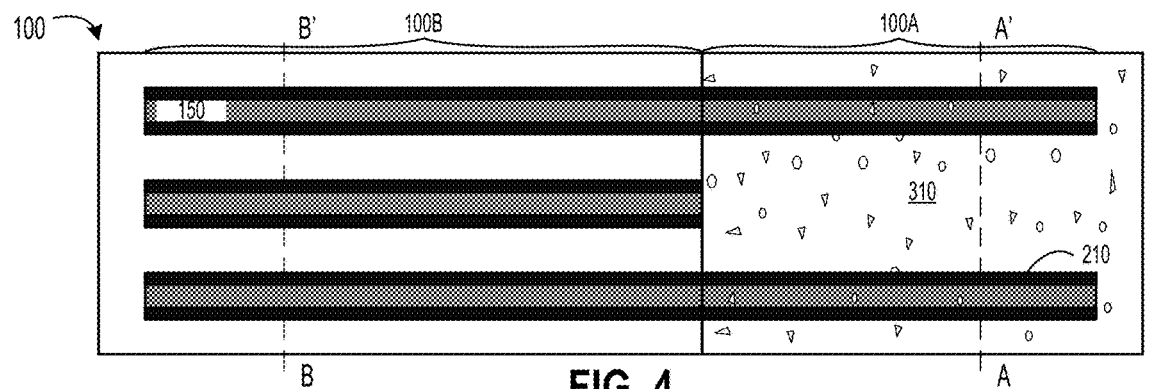
Figure 4A:
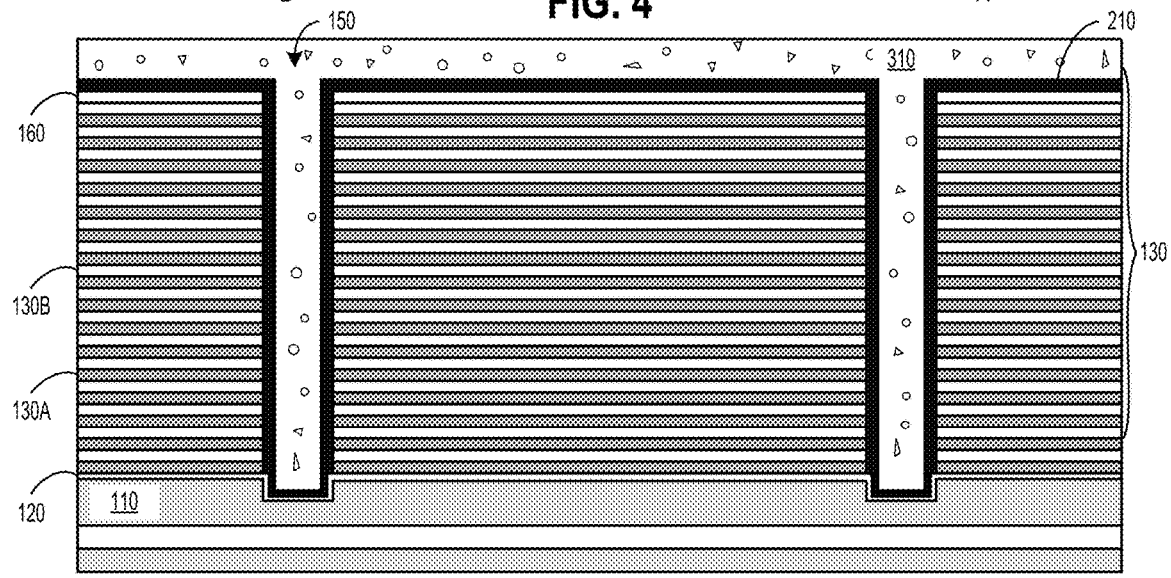
Figure 4B:
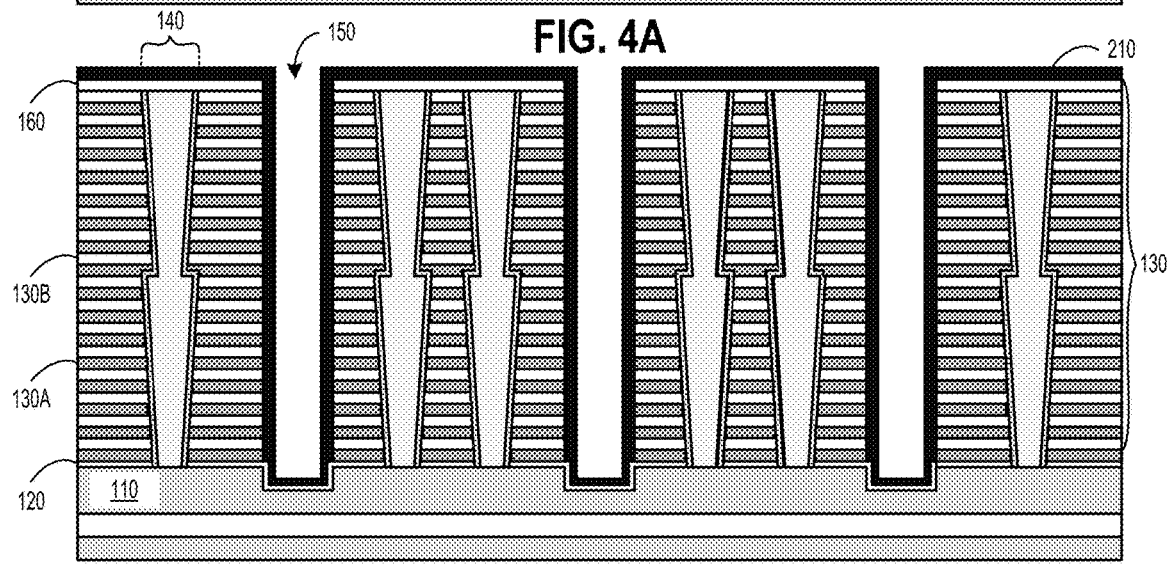

As shown in FIGS. 4, 4A and 4B, a portion of the photo resist layer 310 within the core area 100B is removed. For example, the other portion of the photo resist layer 310 within the stair step area 100A is covered by a mask (not shown), a photolithography process is performed on the portion of the photo resist layer 310 that is not covered by the mask to develop and remove the portion of the photo resist layer 310 within the core area 100B and uncover the liner 210 in the trenches 150 within the core area 100B, and the mask is stripped.

Figure 5:
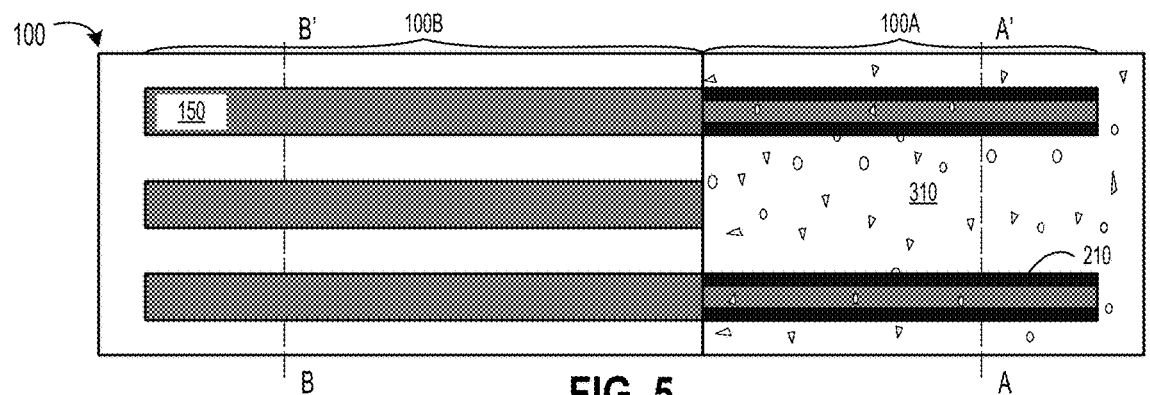
Figure 5A:
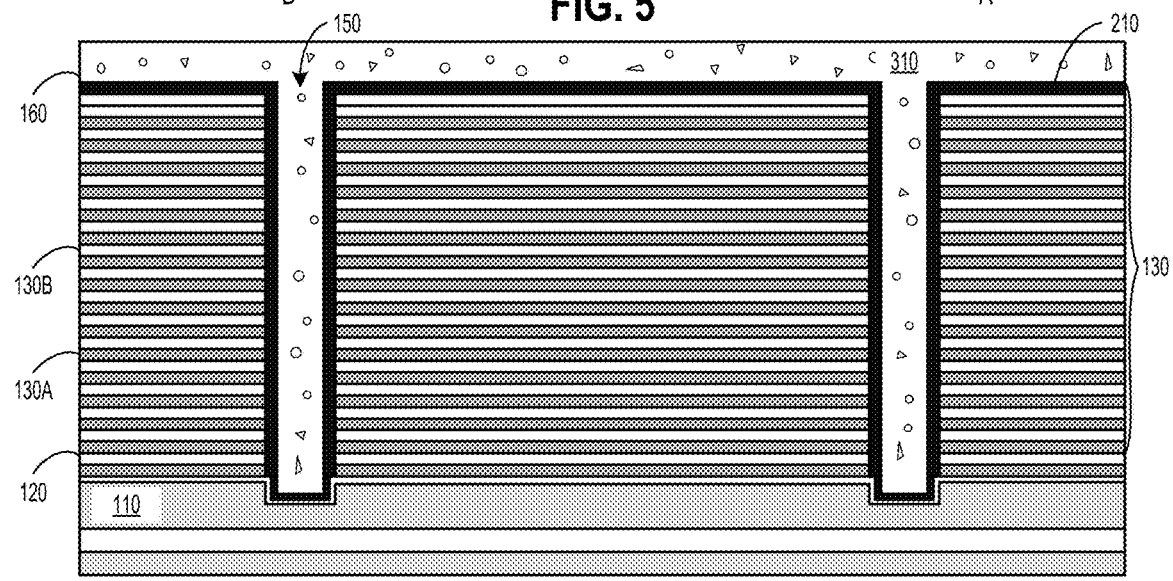
Figure 5B:
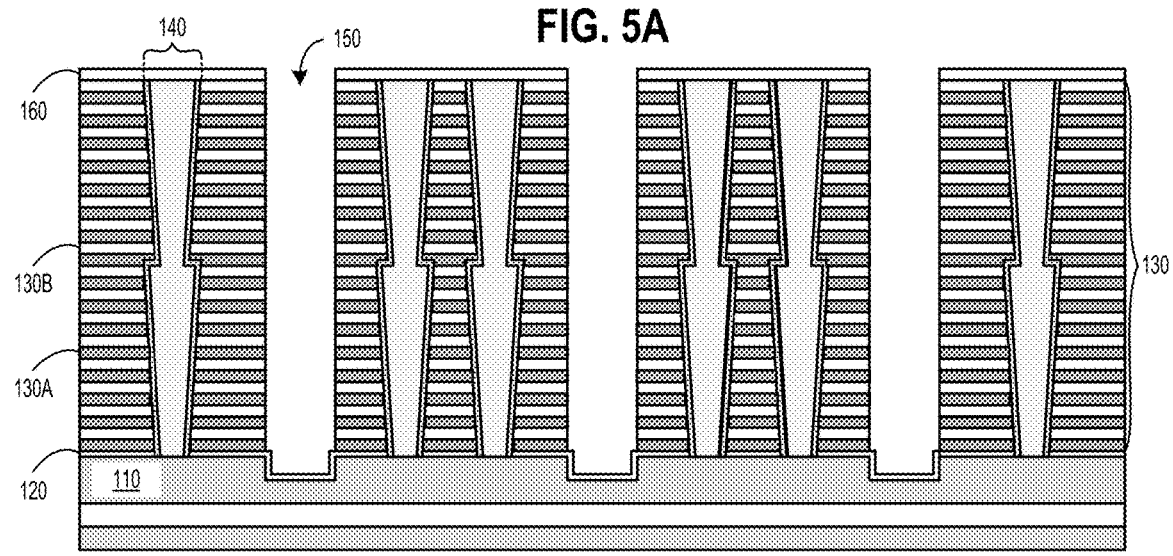

As shown in FIGS. 5, 5A and 5B, the liner 210 in the trenches 150 within the core area 100B is removed. In an embodiment, the liner 210 can be made of polysilicon, and be removed by tetramethyl ammonium hydroxide (TMAH) chemical etching.

Figure 6:
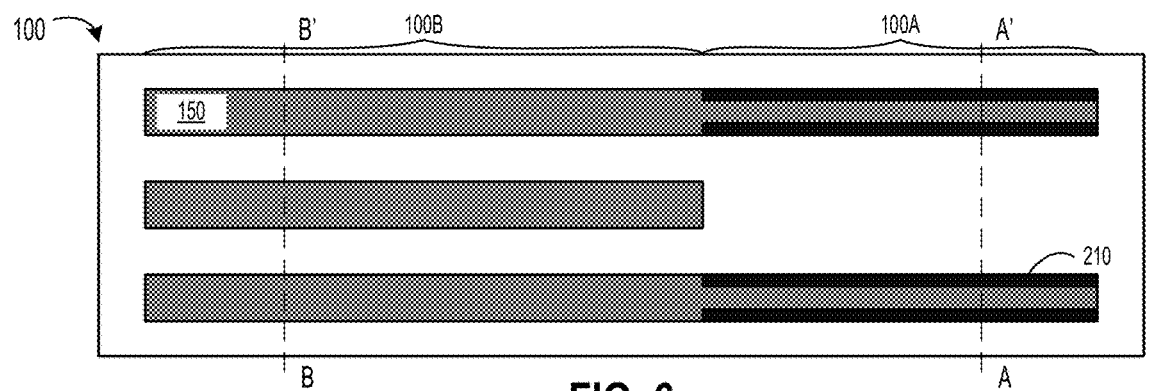
Figure 6A:
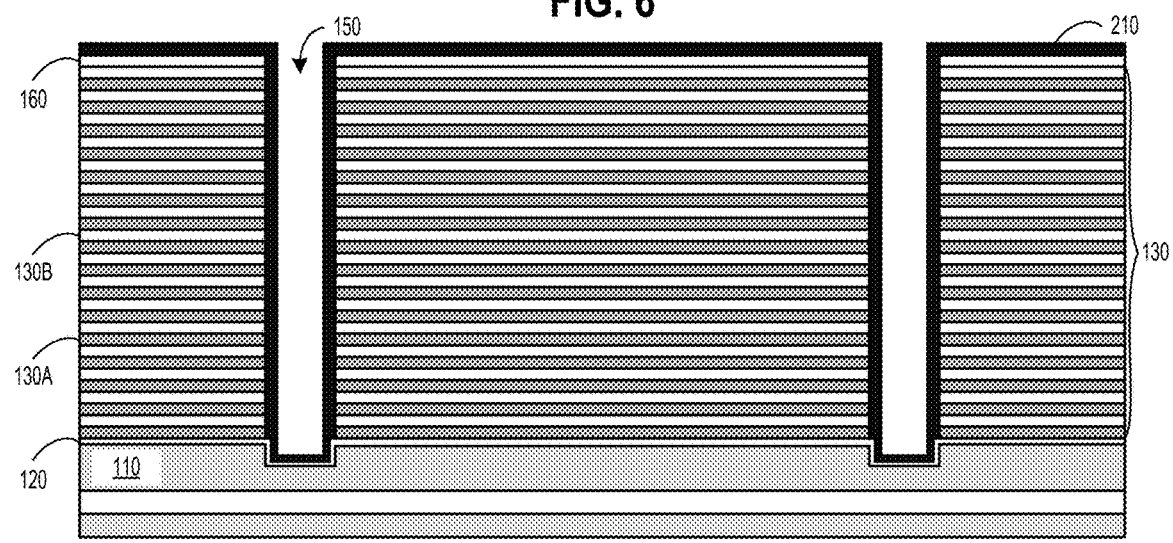
Figure 6B:
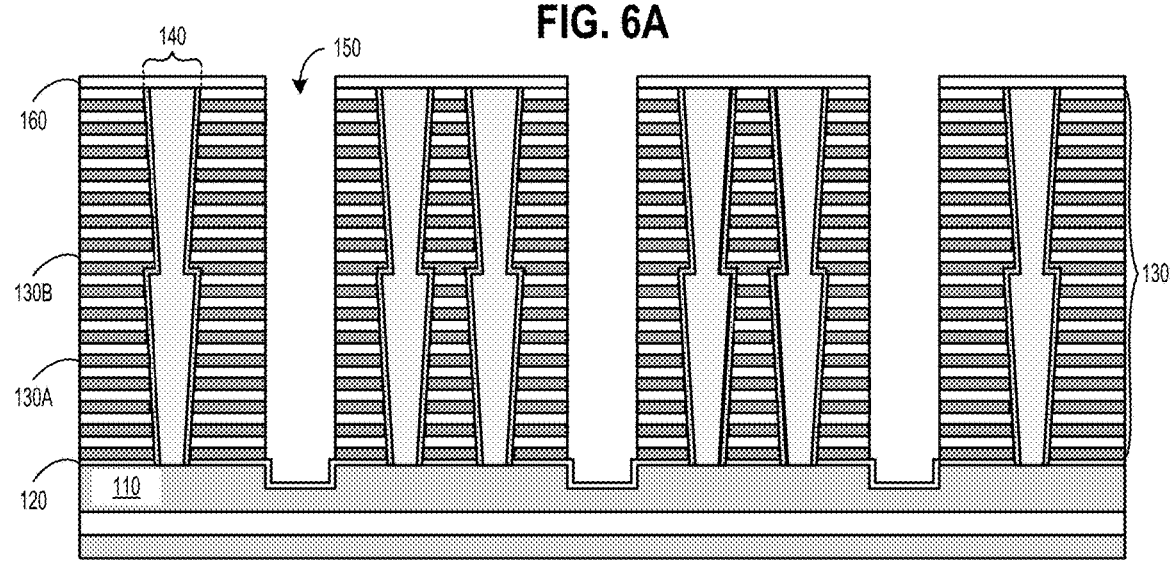

As shown in FIGS. 6, 6A and 6B, the other portion of the photo resist layer 310 within the stair step area 100A is removed. In an embodiment, the photo resist layer 310 can be removed in a wet strip process or a plasma ashing process. For example, in the plasma ashing process a plasma source is introduced to generate a reactive species, such as oxygen or fluorine, which can combine with the photo resist layer 310 remained within the stair step area 100A to form ash, which can then be removed with a vacuum pump.

Figure 7:
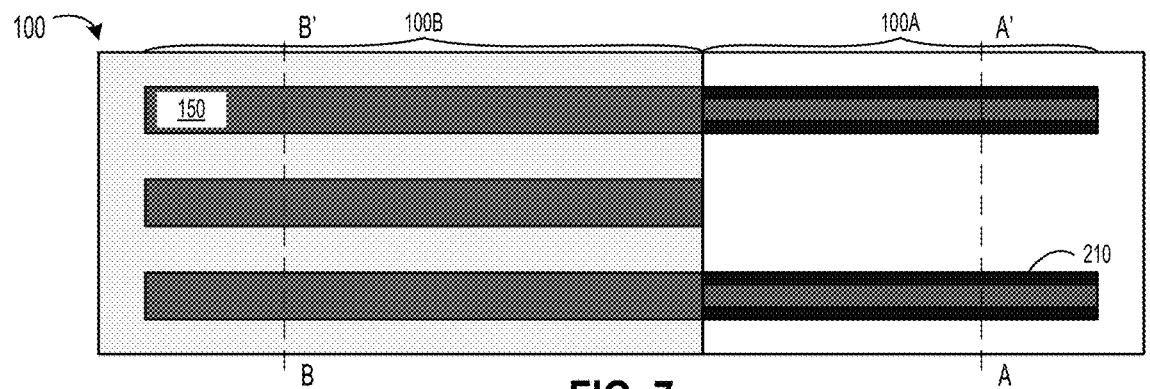
Figure 7A:
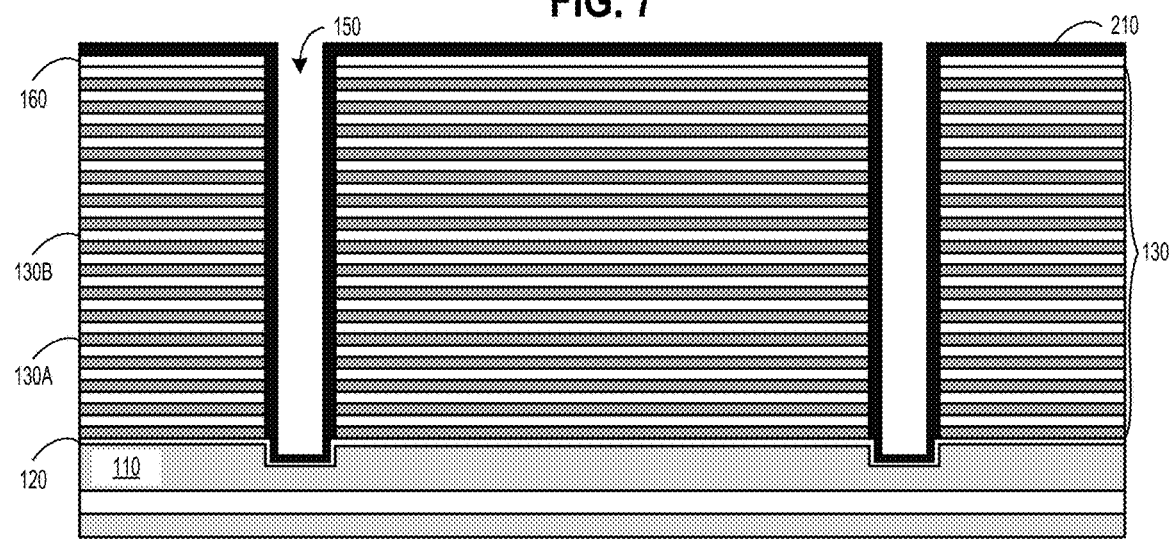
Figure 7B:
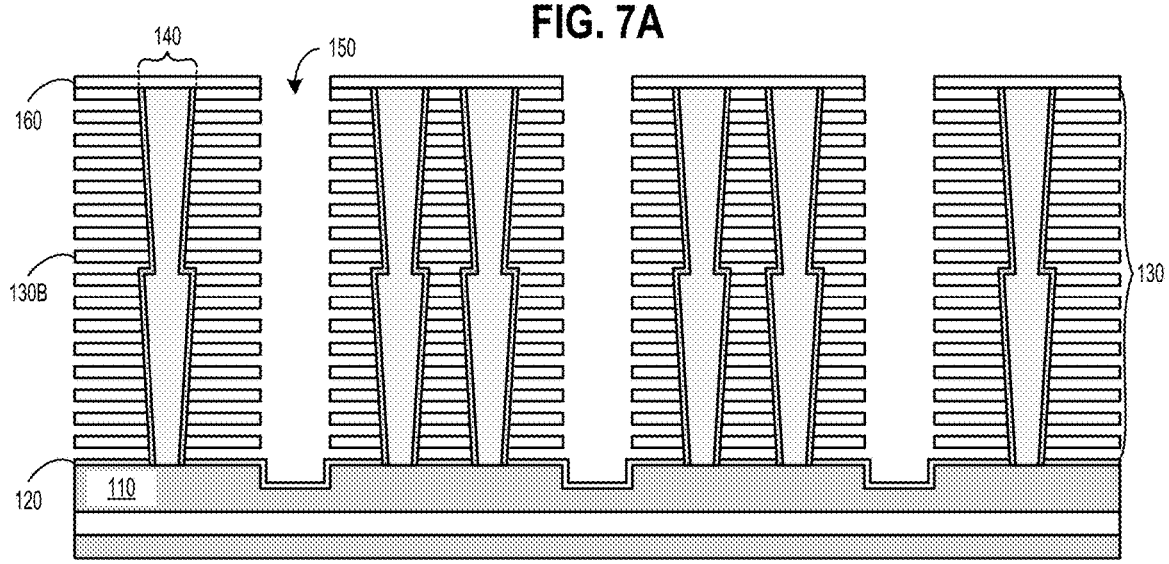

As shown in FIGS. 7, 7A and 7B, the sacrificial layers 130A of the stack 130 within the core area 110B are removed. For example, the sacrificial layers 130A of the stack 130 can be made of silicon nitride, and etchant, e.g., hot $H_2SO_4$, can be applied via the trenches 150 within the core area 100B to etch and remove the sacrificial layers 130A of the stack 130 within the core area 100B. In some embodiments, TMAH can also be used to remove the sacrificial layers 130A. As the sacrificial layers 130A of the stack 130 within the stair step area 100A are covered and sealed tightly and well protected by the liner 210, the etchant that is applied via the trenches 150 within the core area 100B to etch and remove the sacrificial layers 130A of the stack 130 within the core area 100B will not be in contact with and etch the sacrificial layers 130A of the stack 130 within the stair step area 100A.

Figure 8:
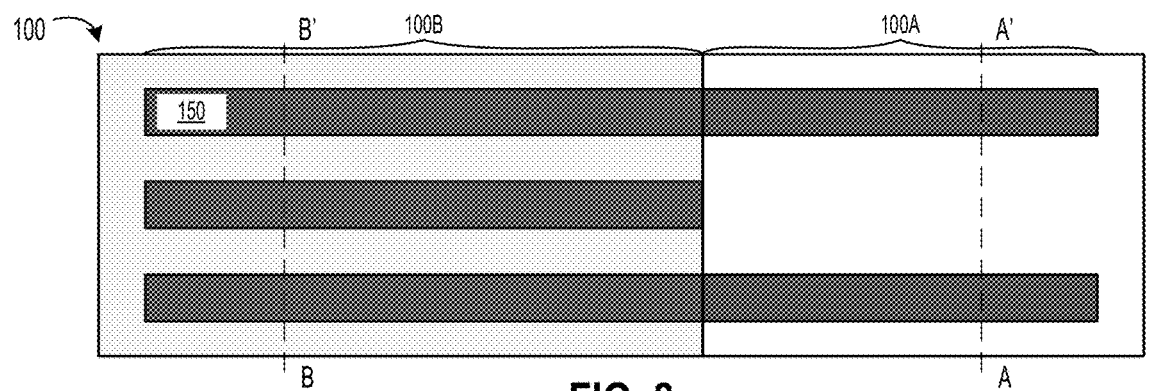
Figure 8A:
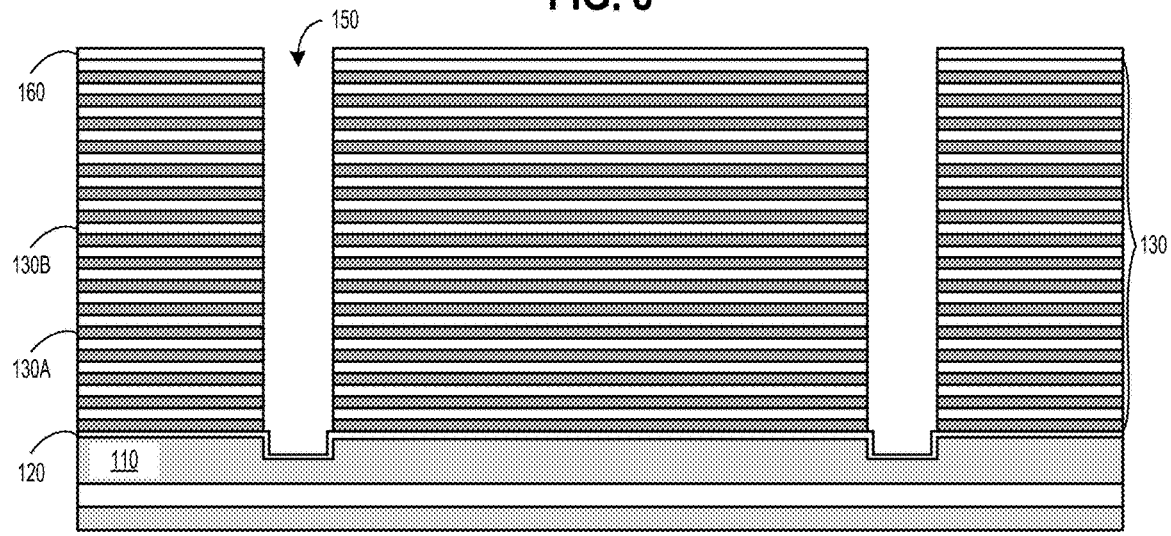
Figure 8B:
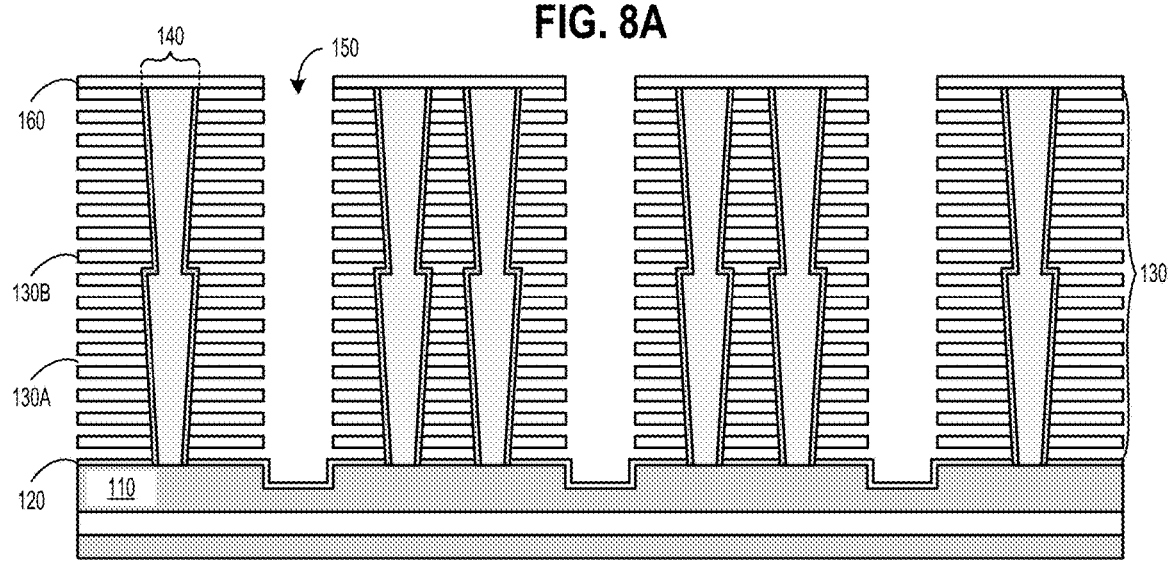

As shown in FIGS. 8, 8A and 8B, the liner 210 in the trenches 150 within the stair step area 100A is removed. In an embodiment, the liner 210 can be made of polysilicon, and be removed by tetramethyl ammonium hydroxide (TMAH) chemical etching.

Figure 9:
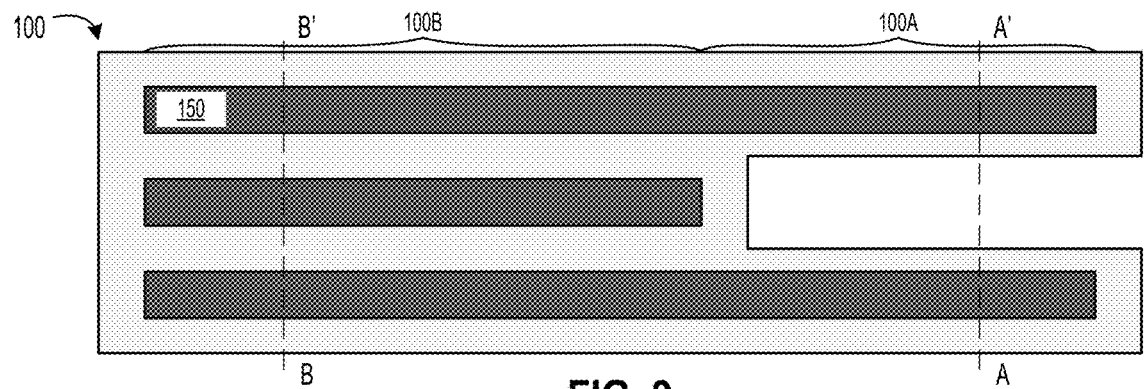
Figure 9A:
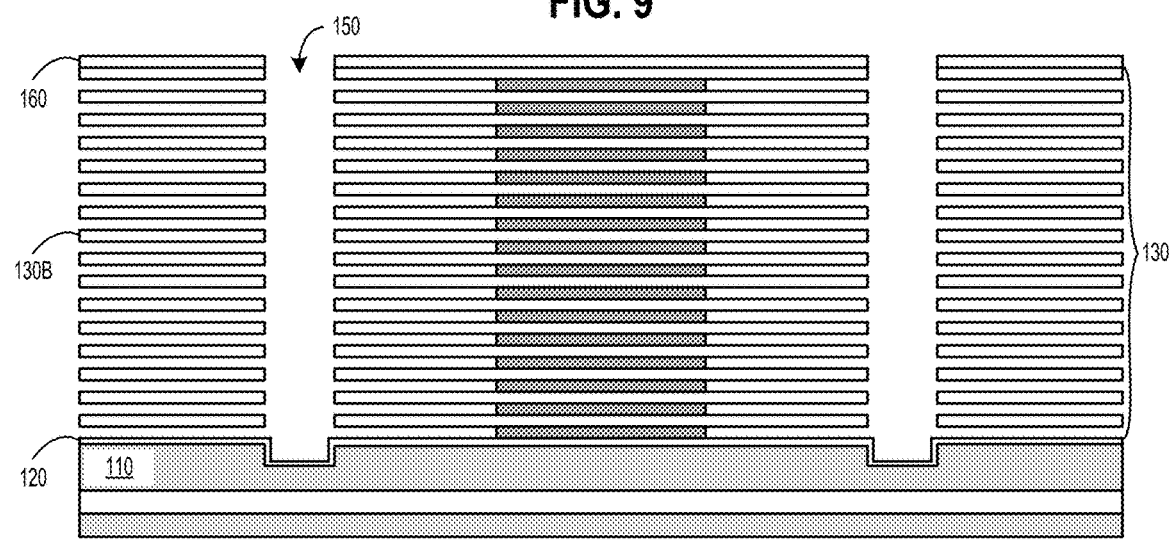
Figure 9B:
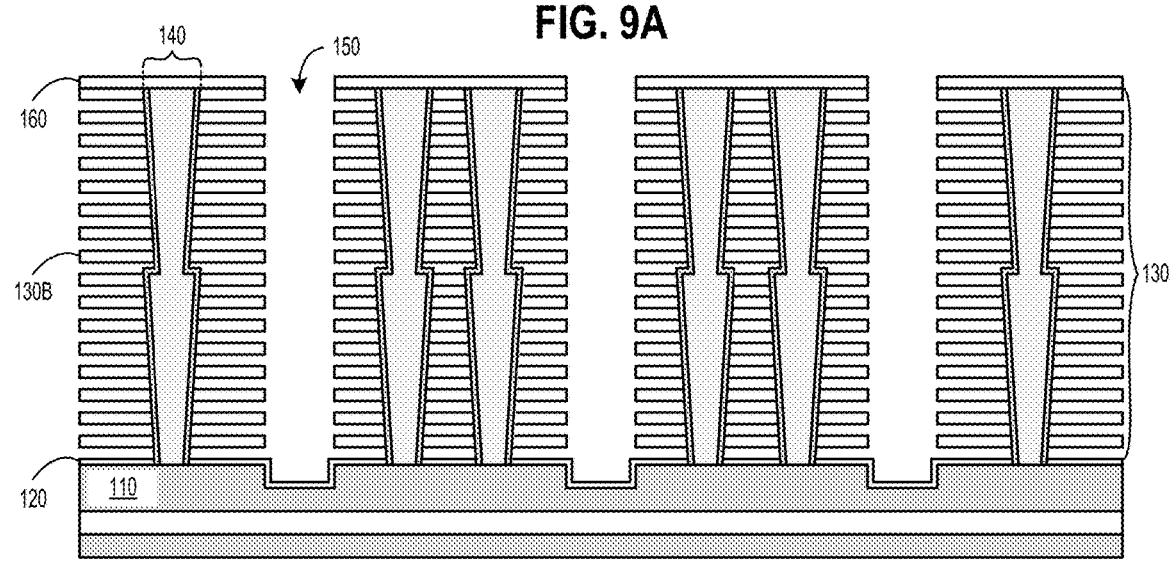

As shown in FIGS. 9, 9A and 9B, the sacrificial layers 130A of the stack 130 within the stair step area 110A are removed. For example, the sacrificial layers 130A of the stack 130 can be made of silicon nitride, and etchant, e.g., hot $H_2SO_4$, can be applied via the trenches 150 within the stair step area 100A to etch and remove the sacrificial layers 130A of the stack 130 within the stair step area 100A. As the sacrificial layers 130A of the stack 130 within the core area 100B have been removed when the sacrificial layers 130A of the stack 130 are removed, the filling of a material, e.g., carbon, in the trenches 150 within the stair step area 100A, as performed in the prior art, can be omitted.

In the example embodiment according to the present disclosure, the exemplary method can involve formation of a liner, deposition of a trench filler material, a photo photolithography process, removal of sacrificial layers within a core area, and removal of sacrificial layers within a stair step area, and is simpler than a conventional method, which may involve deposition of polysilicon in trenches, removal of the polysilicon within a stair step area, removal of sacrificial layers within the stair step area, filling of carbon in the stair step area, removal of polysilicon within a core area, removal of sacrificial layers within the core area, and removal of the carbon.

A conductive material (not shown), such as tungsten (W), cobalt (Co), copper (Cu), Aluminum (Al), titanium (Ti), tantalum (Ta), TiN, TaN, nickel (Ni), doped silicon, silicides (e.g., NiSix, WSix, CoSix, TiSix), or any combination thereof, can be used to fill spaces that are formed after the sacrificial layers 130A of the stack 130 within the core area 100B and the stair step area 100A are removed to form word line layers of the 3D semiconductor structure 100, e.g., a 3D NAND memory device, such that the word line layers can be arranged between the insulating layers 130B.

In the example embodiment, the other portion of the photo resist layer 310 within the stair step area 100A is removed, as shown in FIGS. 6, 6A and 6B, and then the sacrificial layers 130A of the stack 130 within the core area 100B are removed, as shown in FIGS. 7, 7A and 7B. In some embodiments, the removal of the sacrificial layers 130A of the stack 130 within the core area 100B can be performed prior to the removal of the other portion of the photo resist layer 310 within the stair step area 100A. In the example embodiment, the sacrificial layers 130A of the stack 130 within the core area 100B are removed, as shown in FIGS. 7, 7A and 7B, and then the sacrificial layers 130A of the stack 130 within the stair step area 100A are removed, as shown in FIGS. 9, 9A and 9B. In some embodiments, the removal of the sacrificial layers 130A of the stack 130 within the stair step area 100A can be performed prior to the removal of the sacrificial layers 130A of the stack 130 within the core area 100B. For example, the other portion of the photo resist layer 310 within the stair step area 100A can be removed, with the portion of the photo resist layer 310 within the core area 100B intact, followed by removing the liner 210 in the trenches 150 within the stair step area 100A, followed by removing the portion of the photo resist layer 310 within the core area 100B, followed by removing the sacrificial layers 130A of the stack 130 within the stair step area 100A, followed by removing the liner 210 in the trenches 150 within the core area 100B, followed by removing the sacrificial layers 130A of the stack 130 within the core area 100B.

FIGS. 10-17 are top views of various intermediate steps of another exemplary method of manufacturing another exemplary 3D semiconductor structure 1000, in accordance with some embodiments of the present disclosure. The method is used to remove sacrificial layers of a stack of the 3D semiconductor structure 1000 in two steps. The 3D semiconductor structure 1000 can be used to manufacture a 3D NAND memory device. In the example embodiment, the 3D semiconductor structure 1000 also includes the core area 100B and the stair step area 100A. FIGS. 10A-17A are cross-sectional views of the various intermediate steps of the method of manufacturing the exemplary 3D semiconductor structure 1000 corresponding to a cross-section along a cut line AA' within the stair step area 100A shown in FIGS. 10-17. FIGS. 10B-17B are cross-sectional views of the various intermediate steps of the method of manufacturing the exemplary 3D semiconductor structure 1000 corresponding to a cross-section along a cut line BB' within the core area 100B shown in FIGS. 10-17.

Figure 10:
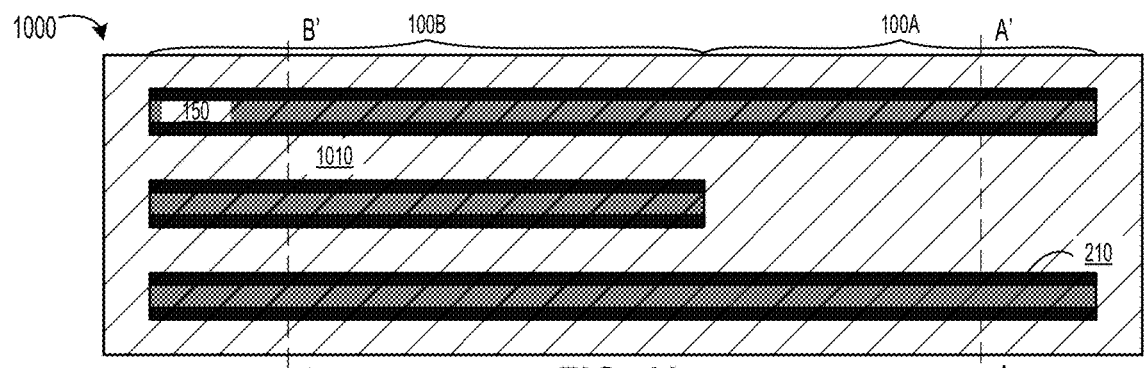
FIGS. 10-17 are cross-sectional views of various intermediate steps of another exemplary method of manufacturing another exemplary 3D semiconductor structure in accordance with some embodiments of the present disclosure.
Figure 10A:
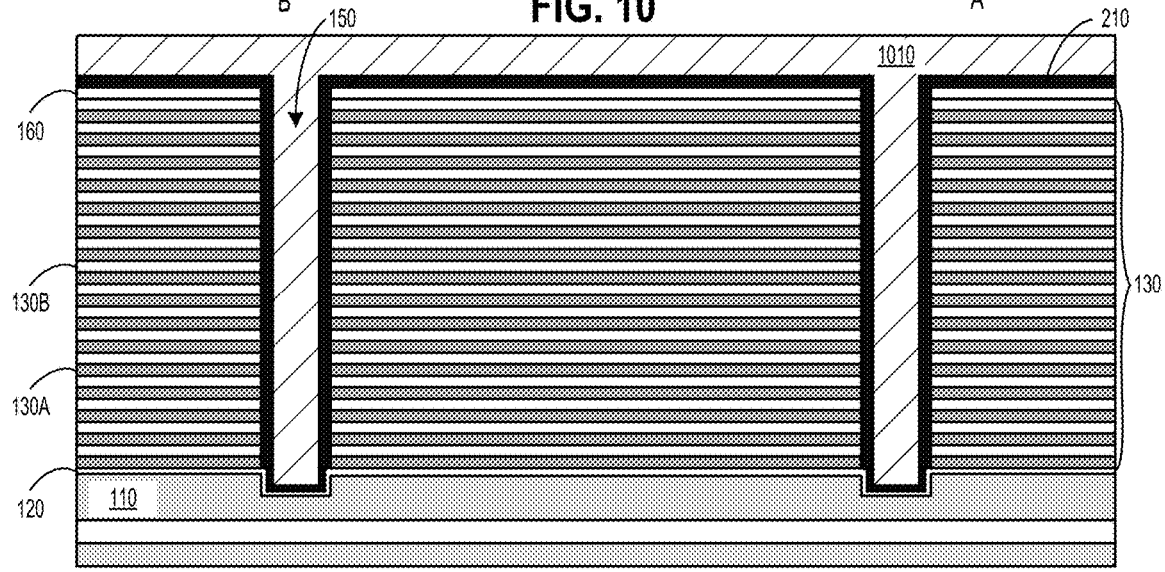
Figure 10B:
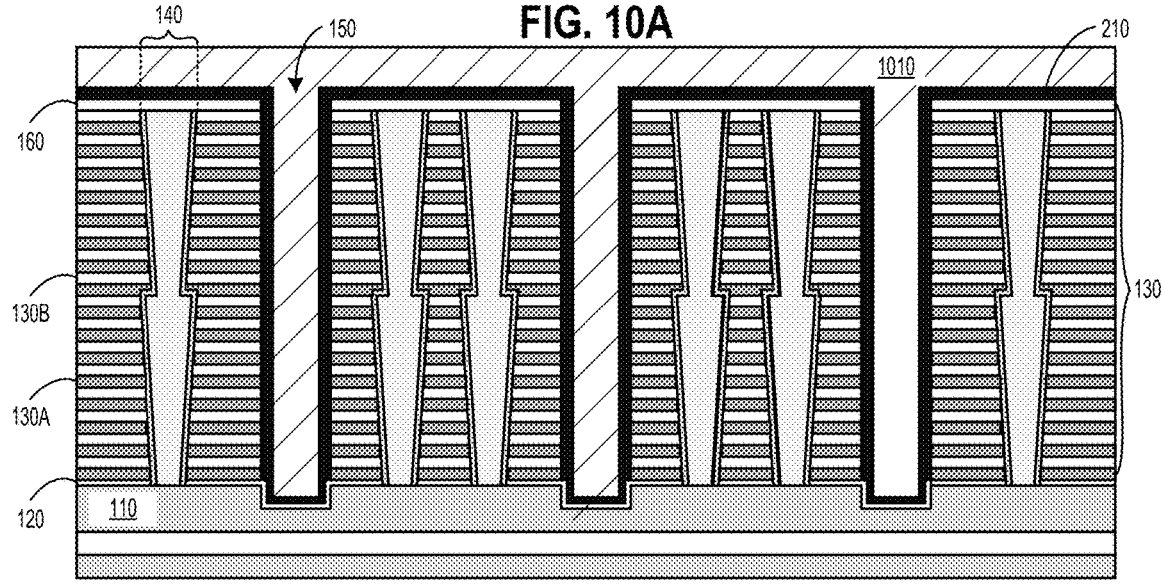

As shown in FIGS. 10, 10A and 10B, which follow FIGS. 2, 2A and 2B, respectively, the semiconductor structure 1000 is coated with some materials. For example, a trench filler material 1010, e.g., carbon or other suitable materials, can be used to fill the trenches 150 and cover the liner 210. In an embodiment, the trench filler material 1010 can further include a SiON layer on the top thereof. The SiON layer is used as a hard mask in a subsequent etch process, e.g., a dry etch process. In some embodiments, the trench filler material 1010 can be deposited and formed by a suitable deposition process, such as a CVD process, a PVD process, an ALD process, an e-beam evaporation process, a sputtering process, a diffusion process, or any combination thereof.

Figure 11:
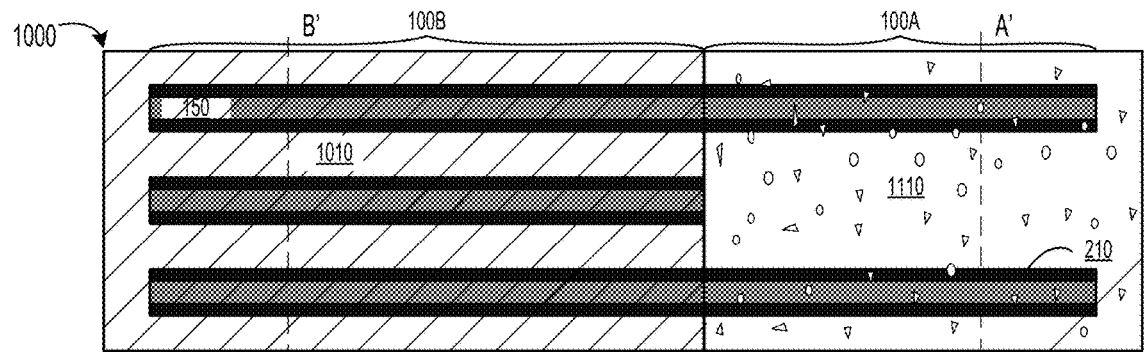
Figure 11A:
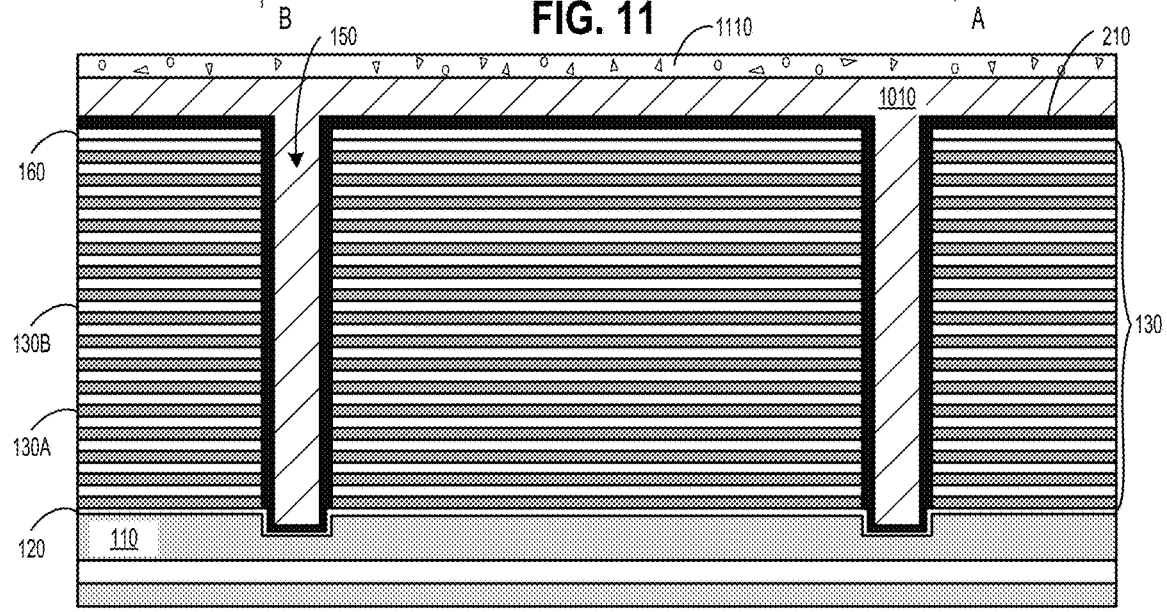
Figure 11B:
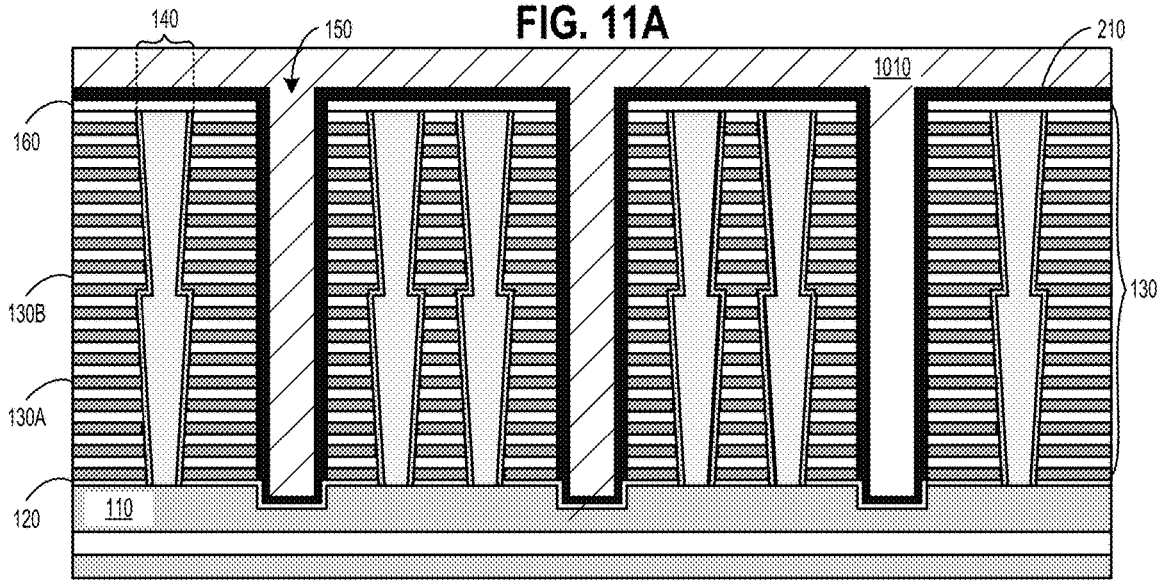

As shown in FIGS. 11, 11A and 11B, a portion of the trench filler material 1010 within the stair step area 100A is coated with a cover material. For example, a dielectric layer or a photo resist layer 1110, positive or negative, can be formed on the portion of the trench filler material 1010 within the stair step area 100A. Then, a photolithography process is performed on the photo resist layer 1110 to develop the photo resist layer 1110.

Figure 12:
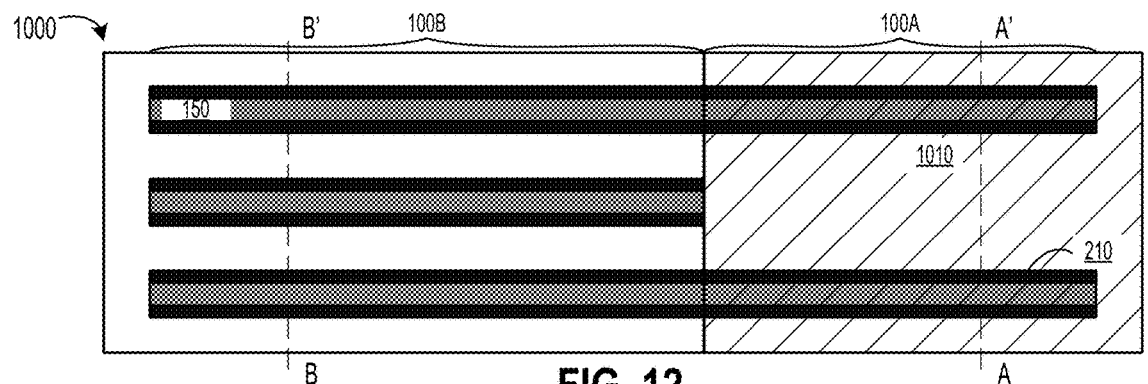
Figure 12A:
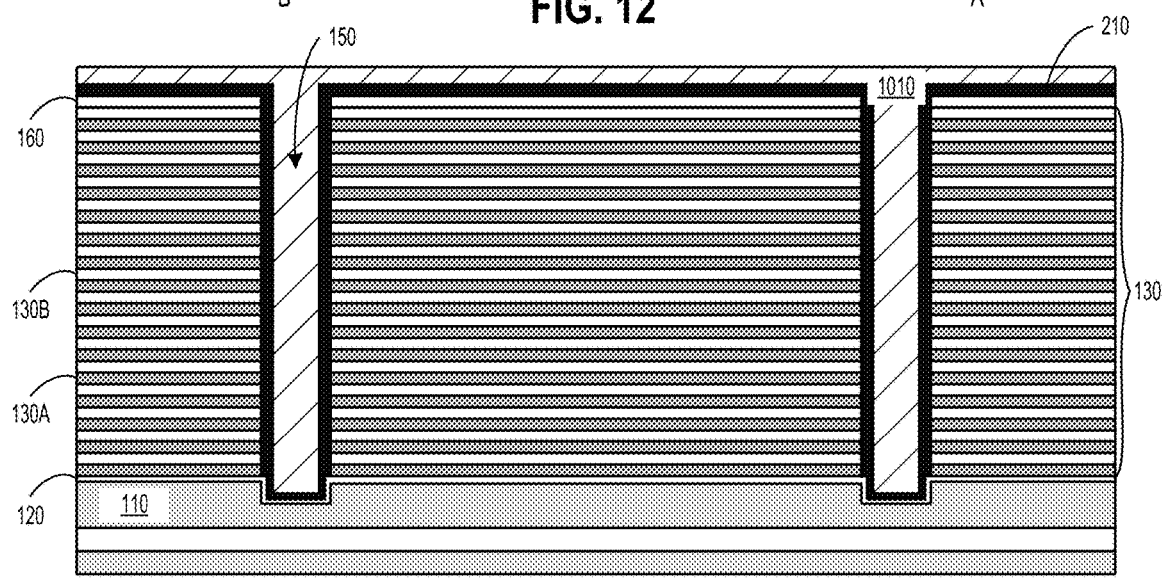
Figure 12B:
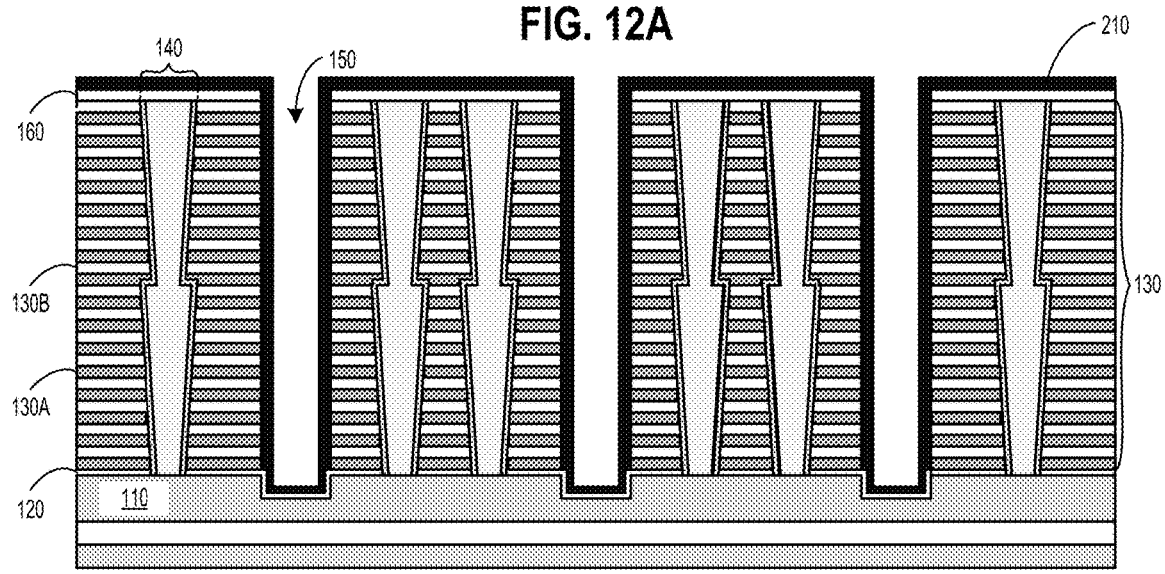

As shown in FIGS. 12, 12A and 12B, the trench filler material 1010 within the core area 100B, which is not covered by the photo resist layer 1110, and the developed photo resist layer 1110 can be etched, e.g., by a dry etch process, such that the entire trench filler material 1010, e.g., carbon, filled in the trenches 150 within the core area 100B is etched away and a portion of the trench filler material 1010 on the liner 210 within the stair step area 100A still exists.

Figure 13:
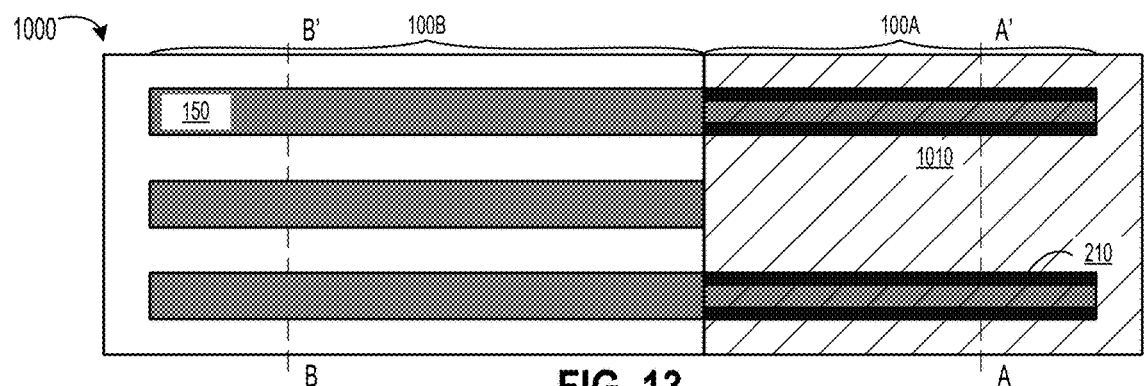
Figure 13A:
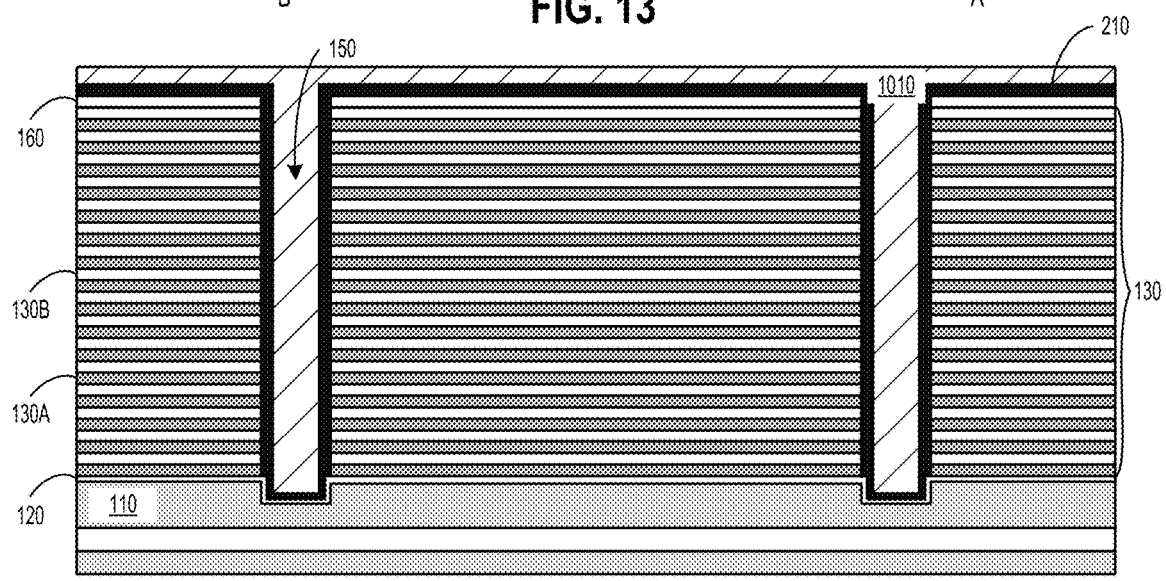
Figure 13B:
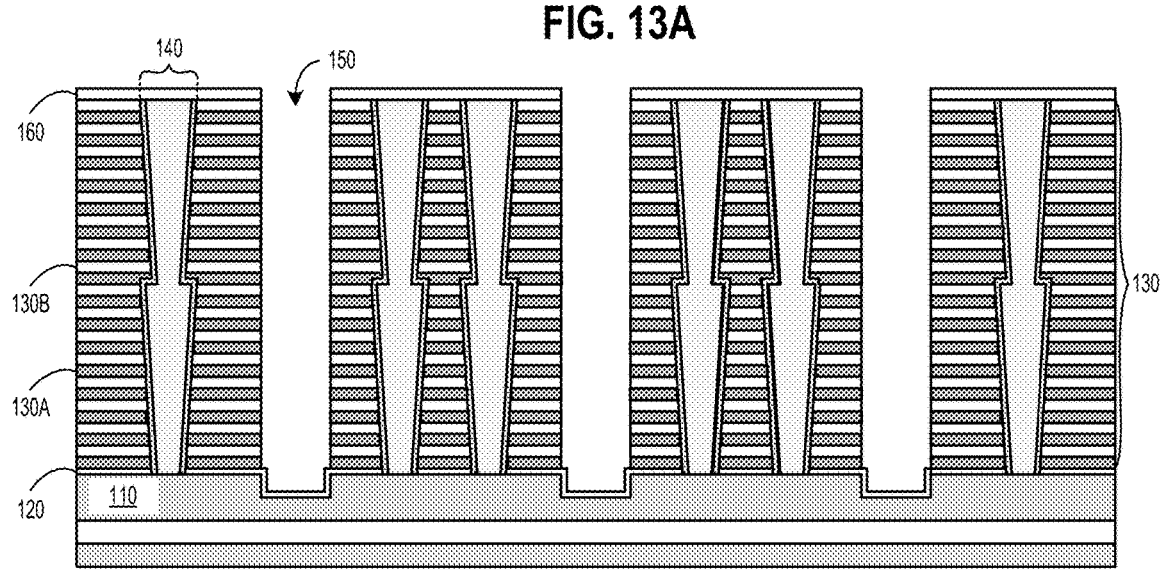

As shown in FIGS. 13, 13A and 13B, the liner 210 in the trenches 150 within the core area 100B is removed. In an embodiment, the liner 210 can be made of polysilicon, and be removed by tetramethyl ammonium hydroxide (TMAH) chemical etching.

Figure 14:
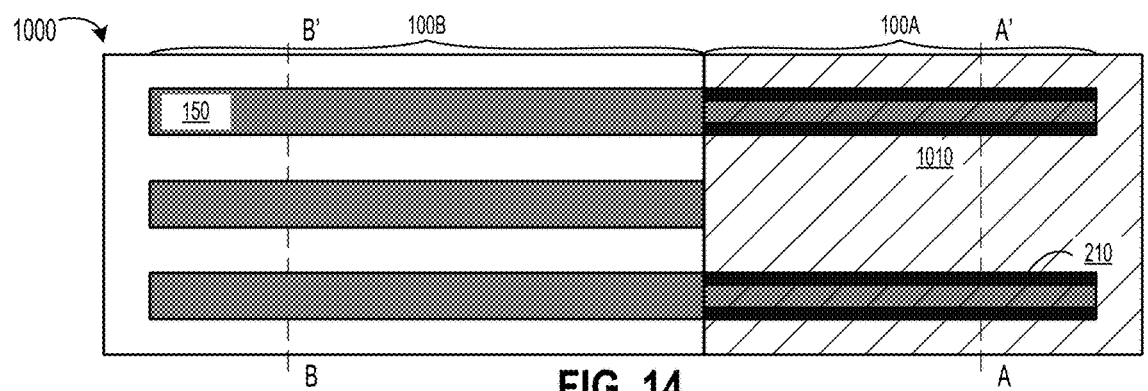
Figure 14A:
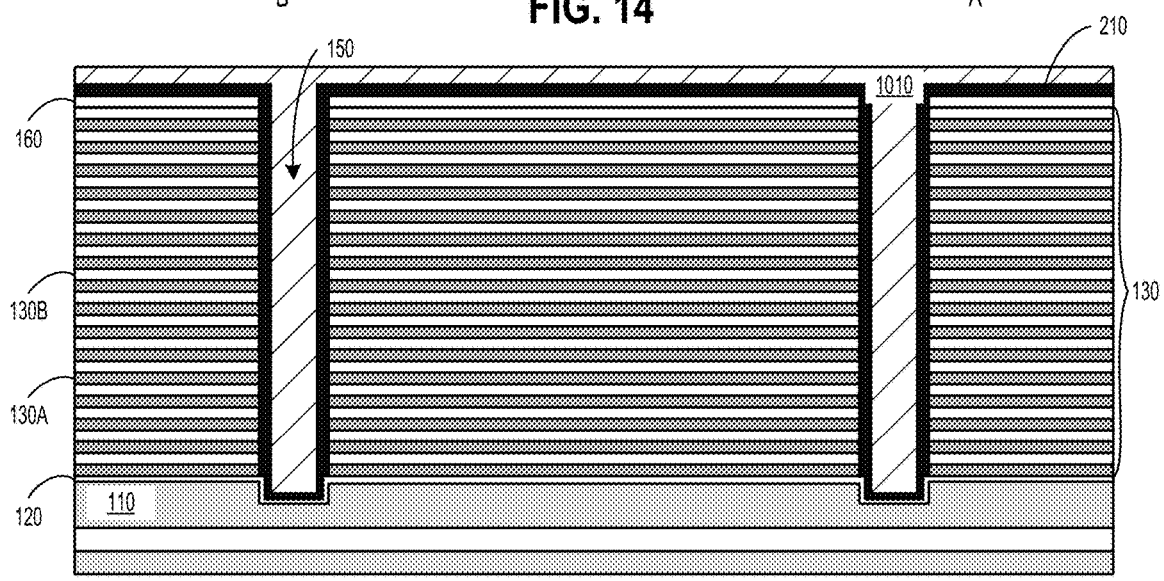
Figure 14B:
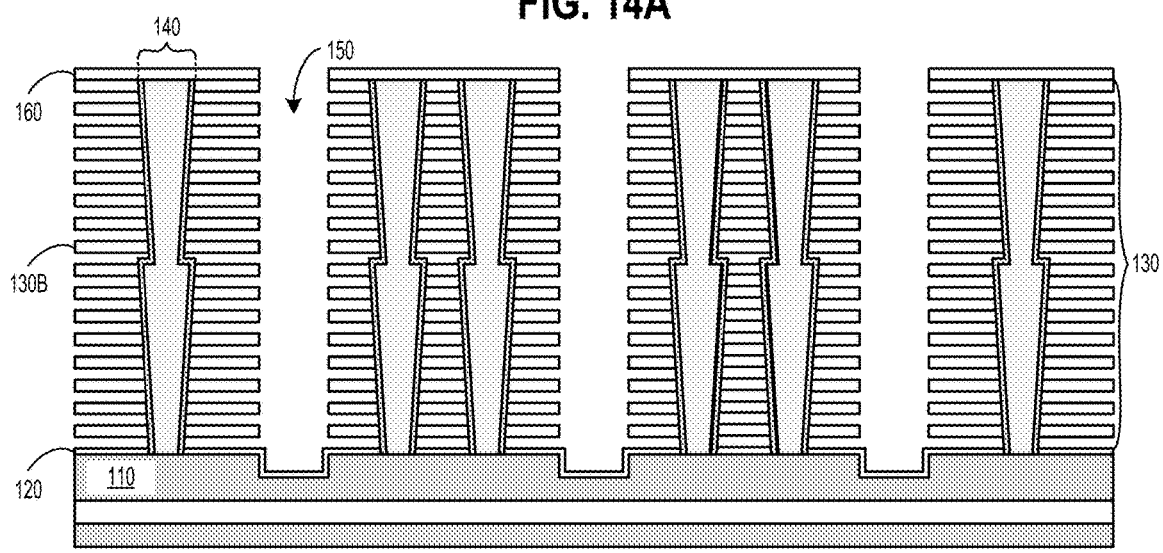

As shown in FIGS. 14, 14A and 14B, the sacrificial layers 130A of the stack 130 within the core area 110B are removed. For example, the sacrificial layers 130A of the stack 130 can be made of silicon nitride, and etchant, e.g., hot $H_2SO_4$, can be applied via the trenches 150 within the core area 100B to etch and remove the sacrificial layers 130A of the stack 130 within the core area 100B. In some embodiments, TMAH can also be used to remove the sacrificial layers 130A. As the sacrificial layers 130A of the stack 130 within the stair step area 100A are still covered tightly and well protected by the liner 210 and the trench filler material 1010, the etchant that is applied via the trenches 150 within the core area 100B to etch and remove the sacrificial layers 130A of the stack 130 within the core area 100B will not be in contact with and etch the sacrificial layers 130A of the stack 130 within the stair step area 100A.

Figure 15:
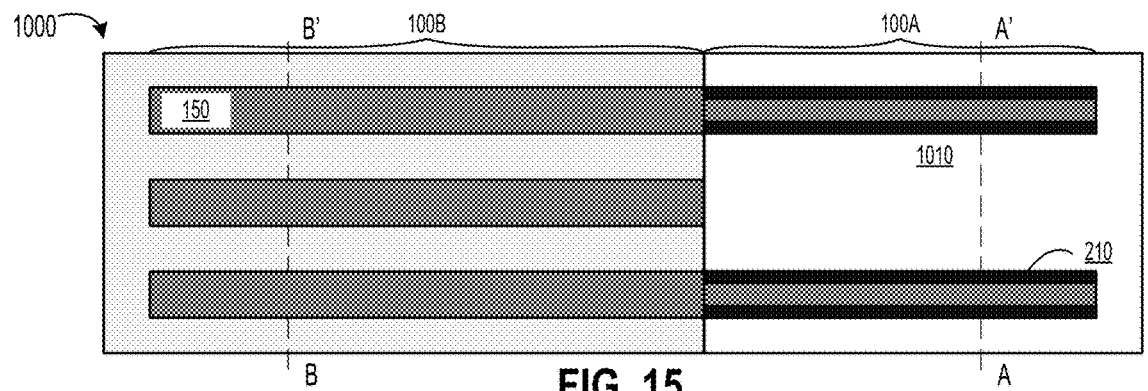
Figure 15A:
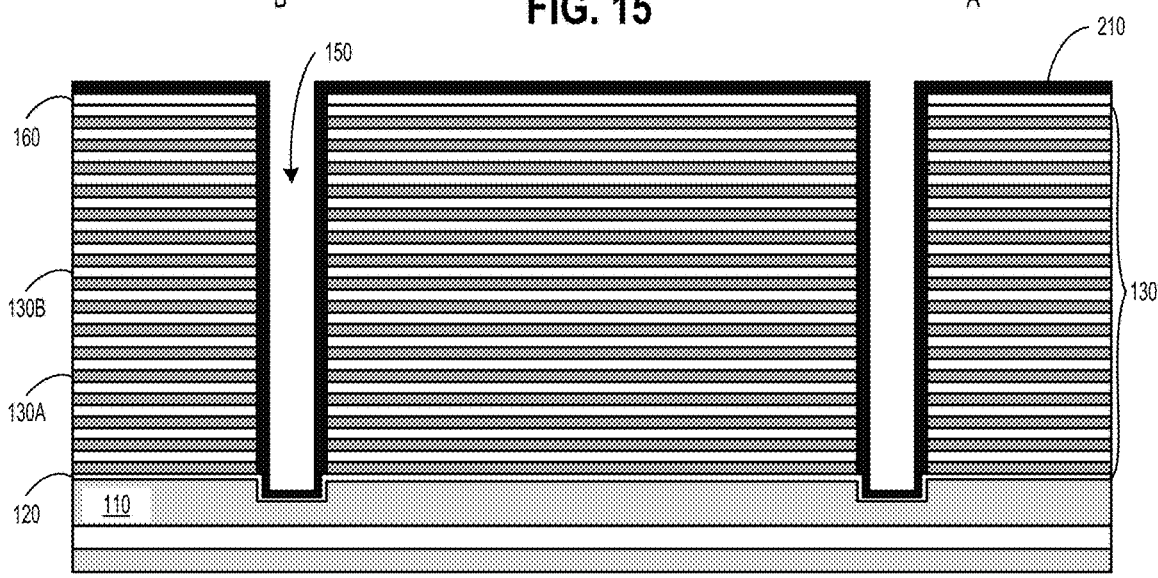
Figure 15B:
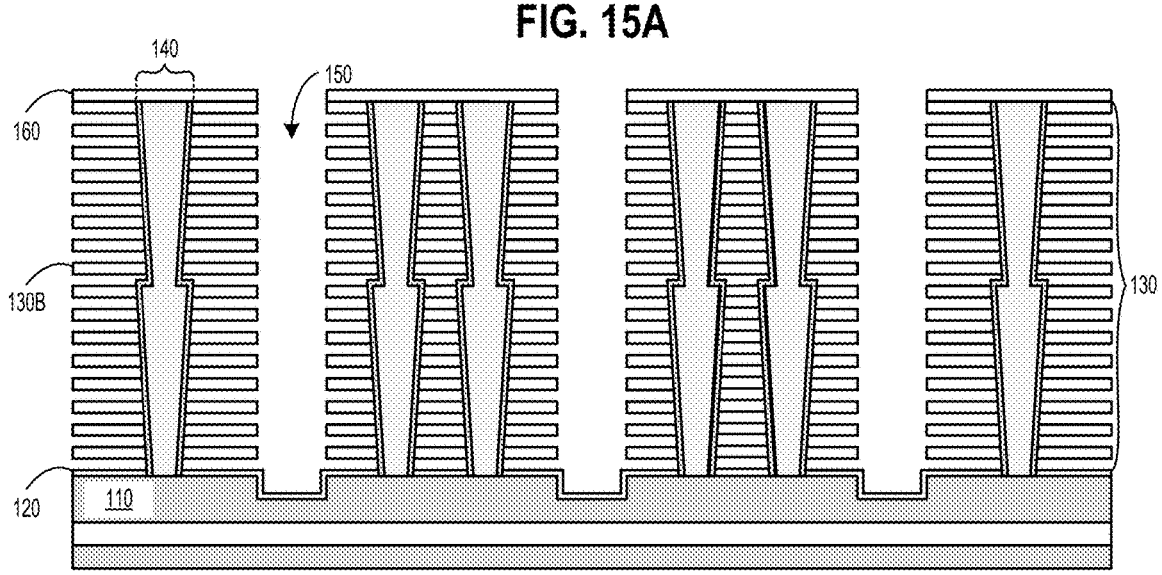

As shown in FIGS. 15, 15A and 15B, the trench filler material 1010 within the stair step area 100A is removed. In an embodiment, the trench filler material 1010 can be removed in a wet strip process or a plasma ashing process. For example, in the plasma ashing process a plasma source is introduced to generate a reactive species, such as oxygen or fluorine, which can combine with the trench filler material 1010 remained within the stair step area 100A to form ash, which can then be removed with a vacuum pump.

Figure 16:
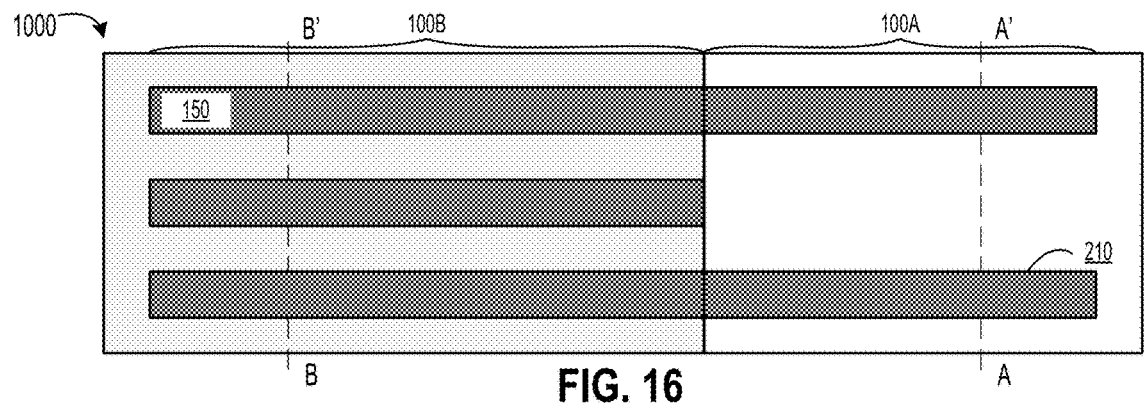
Figure 16A:
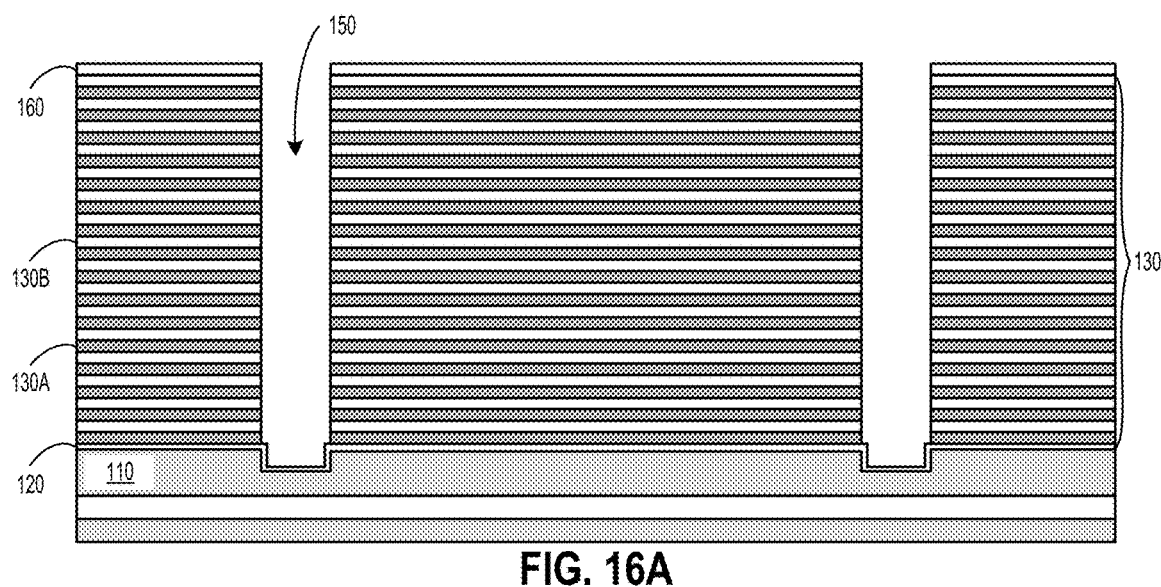
Figure 16B:
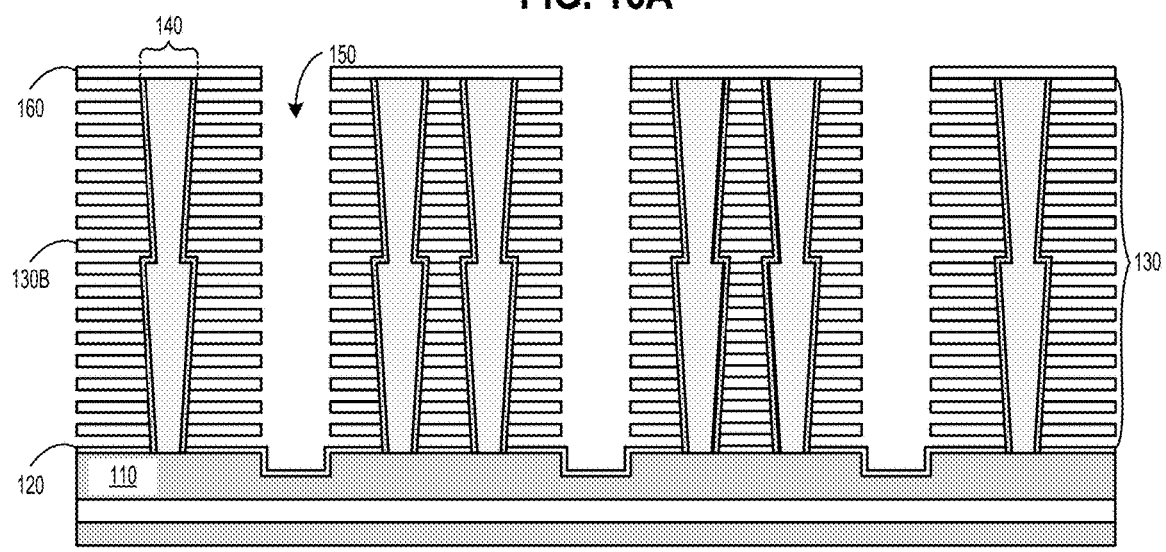

As shown in FIGS. 16, 16A and 16B, the liner 210 in the trenches 150 within the stair step area 100A is removed. In an embodiment, the liner 210 can be made of polysilicon, and be removed by TMAH chemical etching.

Figure 17:
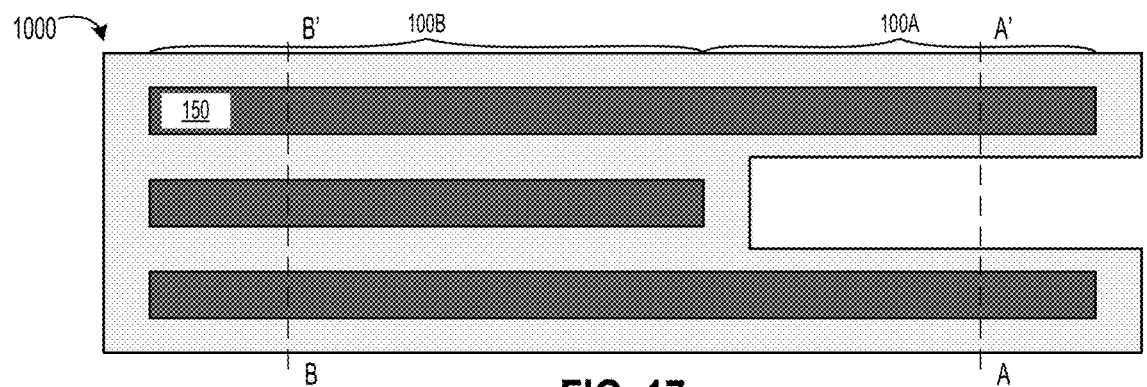
Figure 17A:
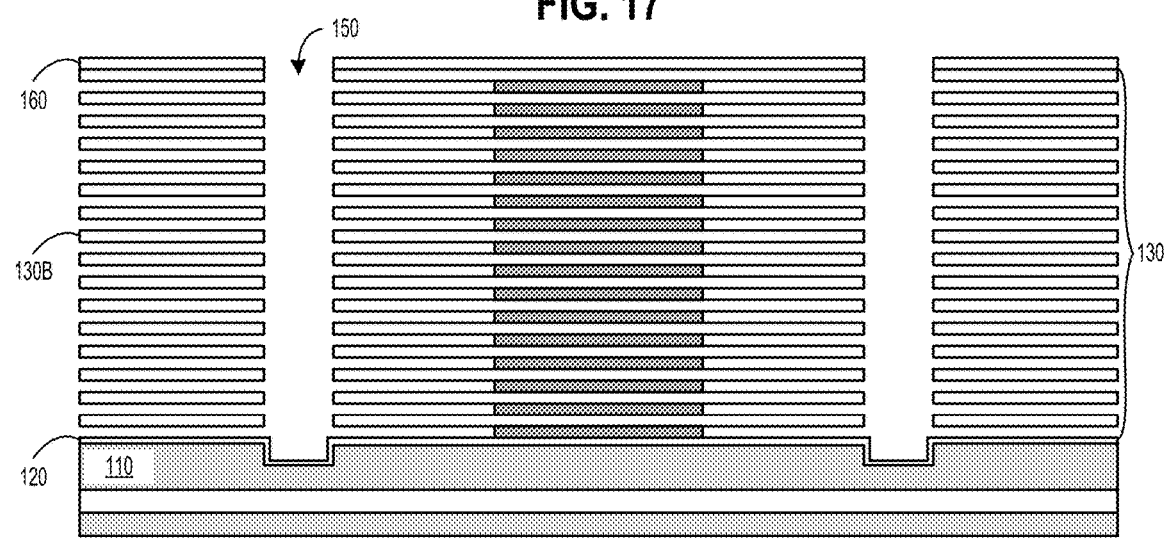
Figure 17B:
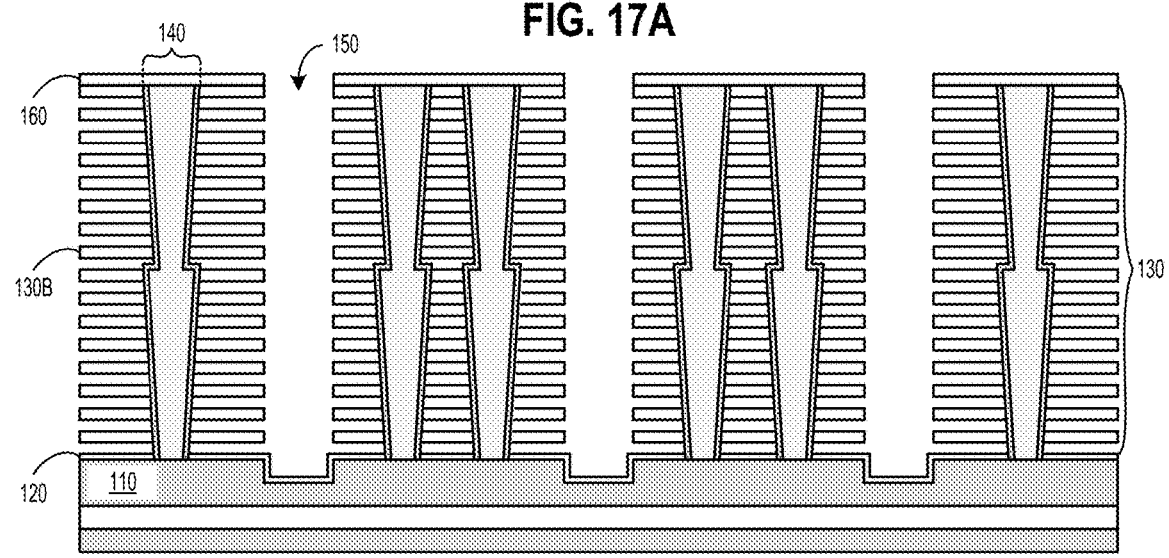

As shown in FIGS. 17, 17A and 17B, the sacrificial layers 130A of the stack 130 within the stair step area 110A are removed. For example, the sacrificial layers 130A of the stack 130 can be made of silicon nitride, and etchant, e.g., hot $H_2SO_4$, can be applied via the trenches 150 within the stair step area 100A to etch and remove the sacrificial layers 130A of the stack 130 within the stair step area 100A. Similarly, a conductive material (not shown), such as W, Co, Cu, Al, Ti, Ta, TiN, TaN, Ni, doped silicon, silicides (e.g., NiSix, WSix, CoSix, TiSix), or any combination thereof, can be used to fill spaces that are formed after the sacrificial layers 130A of the stack 130 within the core area 100B and the stair step area 100A are removed to form word line layers of the 3D semiconductor structure 100, e.g., a 3D NAND memory device, such that the word line layers can be arranged between the insulating layers 130B.

Figure 18:
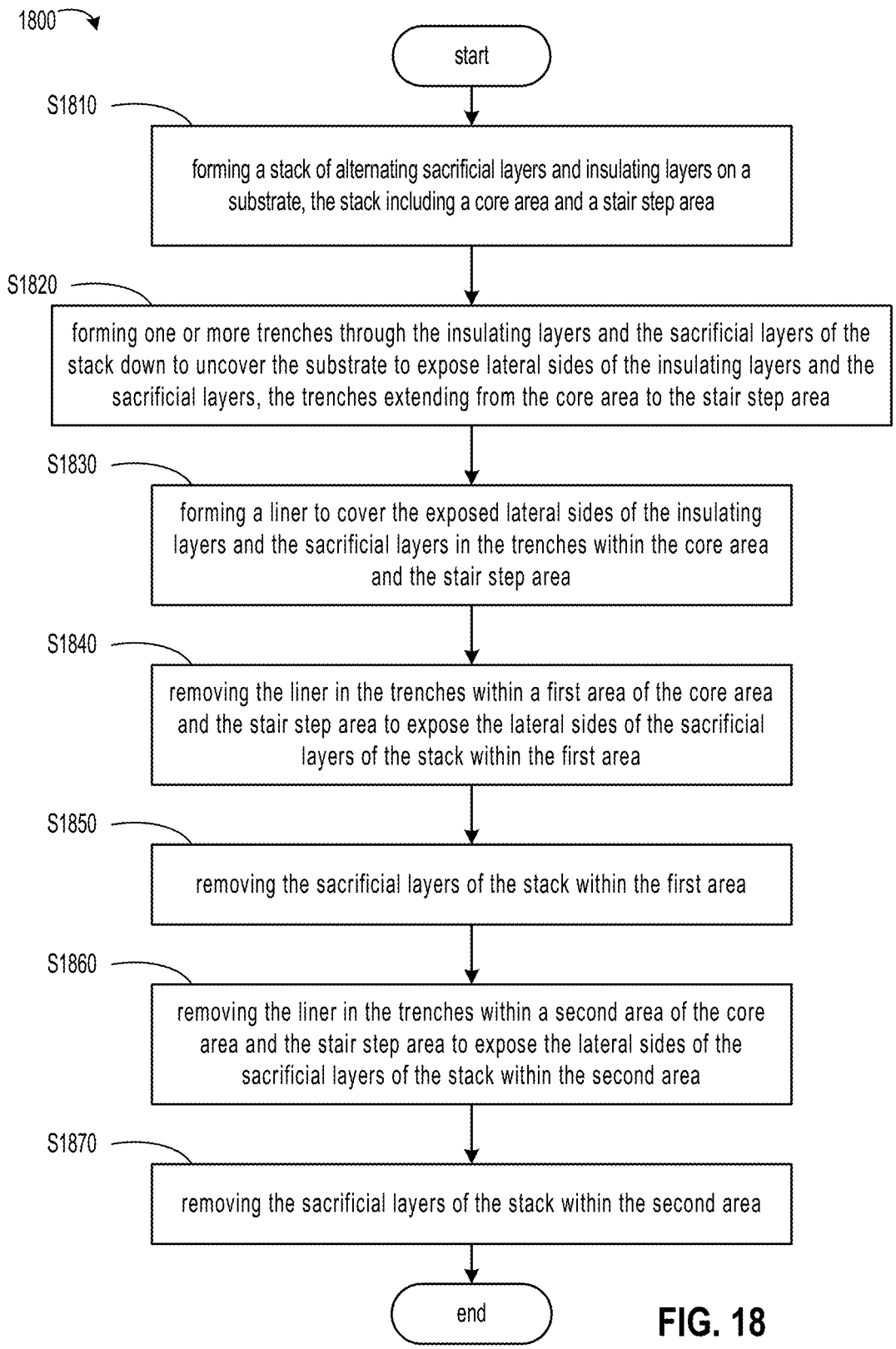
FIG. 18 is a flow chart of an exemplary of manufacturing a 3D semiconductor structure in accordance with some embodiments of the present disclosure.

FIG. 18 is a flow chart of an exemplary method 1800 of manufacturing a 3D semiconductor structure, e.g., the 3D semiconductor structures 100 and 1000, in accordance with some embodiments of the present disclosure. The method 1800 can be used to remove sacrificial layers of a stack of the 3D semiconductor structure in two steps. It should be understood that the process steps shown in the method 1800 are not exhaustive and that other process steps can be performed as well before, after, or between any of the illustrated process steps. In some embodiments, some process steps of the exemplary method 1800 can be omitted or other process steps can be included, which are not described here for simplicity. In some embodiments, process steps of the method 1800 can be performed in a different order and/or vary.

The method 1800 starts at step S1810, at which a stack of alternating insulating layers and sacrificial layers are formed over a substrate, the stack including a core area and a stair step area. For example, a stack 130 of alternating sacrificial layers 130A and insulating layers 130B can be formed on a substrate 110, as shown in FIGS. 1, 1A and 1B.

At step S1820, one or more trenches through the insulating layers and the sacrificial layers of the stack down to uncover the substrate are formed to expose lateral sides of the insulating layers and the sacrificial layers, the trenches extending from the core area to the stair step area. For example, one or more trenches 150 can be formed, as shown in FIGS. 1, 1A and 1B.

At step S1830, a liner is formed to cover the exposed lateral sides of the insulating layers and the sacrificial layers in the trenches within the core area and the stair step area. For example, a liner 210 is formed to cover the exposed lateral sides of the insulating layers 130B and the sacrificial layers 130A of the stack 130 in the trenches 150 within the core area 100B and the stair step area 100A, as shown in FIGS. 2, 2A and 2B.

At step S1840, the liner in the trenches within a first area of the core area and the stair step area is removed to expose the lateral sides of the sacrificial layers of the stack within the first area. For example, the liner 210 in the trenches 150 within the core area 100B is removed to expose the lateral sides of the sacrificial layers 130A of the stack 130 within the core area 100B, as shown in FIGS. 5, 5A and 5B.

At step S1850, the sacrificial layers of the stack within the first area are removed. For example, the sacrificial layers 130A of the stack 130 within the core area 100B are removed, as shown in FIGS. 7, 7A and 7B.

At step S1860, the liner in the trenches within a second area of the core area and the stair step area to expose the lateral sides of the sacrificial layers of the stack within the second area. For example, the liner 210 in the trenches 150 within the stair step area 100A is removed to expose the lateral sides of the sacrificial layers 130A of the stack 130 within the stair step area 100A, as shown in FIGS. 8A, 8B and 8C.

At step S1870, the sacrificial layers of the stack within the second area are removed. For example, the sacrificial layers 130A of the stack 130 within the stair step area 100A are removed, as shown in FIGS. 9, 9A and 9B.

The various embodiments described herein offer several advantages over related examples. For example, in the present disclosure, stair step contacts (SCTs) can be formed to function as word line contacts. The SCTs can be formed by applying processes that, for example, include an oxide deposition, an etching, a tungsten deposition, an oxide filling, and a tungsten plug formation to complete the word line contact formation, and the connection and isolation between the word line contacts and the word line layers. The stair step area around the SCTs can include a tungsten plate stop layer to prevent a backside DCH punching through the stair step area. A trench structure can be formed under a GLS in advance and filled with oxide to ensure that the GLS gouging is positioned in the silicon substrate, or is positioned below a bottom polysilicon layer (such as the process stop layer 149) but above the silicon substrate. The backside poly CMP can stop in an oxide layer between a top polysilicon layer and the bottom polysilicon layer, which can be beneficial to control the removal of the GLS sacrificial polysilicon. In the present disclosure, the formation of oxide trench structure under GLS can well control the position of GLS gouging, which can be beneficial to control the process window to form the back GLS opening (opened from a backside of the silicon substrate). In addition, methods provided in the present disclosure can simplify the 3D NAND process flow and reduce the manufacturing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
    forming a stack of alternating insulating layers and sacrificial layers over a substrate, the stack including a core area and a stair step area;
    forming one or more trenches through the insulating layers and the sacrificial layers of the stack down to uncover the substrate to expose lateral sides of the insulating layers and the sacrificial layers, the trenches extending from the core area to the stair step area;
    forming a liner to cover the exposed lateral sides of the insulating layers and the sacrificial layers in the trenches within the core area and the stair step area;
    removing the liner in the trenches within a first area of the core area and the stair step area to expose the lateral sides of the sacrificial layers of the stack within the first area;
    removing the sacrificial layers of the stack within the first area;
    removing the liner in the trenches within a second area of the core area and the stair step area to expose the lateral sides of the sacrificial layers of the stack within the second area; and
    removing the sacrificial layers of the stack within the second area.

2. The method of claim 1, wherein the liner is formed in an atomic layer deposition (ALD) process.

3. The method of claim 1, wherein the first area is the core area.

4. The method of claim 1, wherein the first area is the stair step area.

5. The method of claim 1, further comprising:
    filling with a conductive material spaces that are formed after the sacrificial layers of the stack are removed.

6. The method of claim 1, further comprising:
prior to removing the liner in the trenches within the first area, filling the trenches with a trench filler material, and removing the trench filler material filled in the trenches within the first area.

7. The method of claim 6, further comprising:
prior to removing the trench filler material filled in the trenches within the first area, covering the trench filler material filled in the trenches within the second area, with the trench filler material in the trenches within the first area uncovered.

8. The method of claim 7, wherein the trench filler material is a photo resist material, and removing the trench filler material includes performing a photolithography process to develop the photo resist material in the trenches within the first area and removing the developed photo resist material.

9. The method of claim 7, wherein the trench filler material includes carbon having a SiON layer on a top thereof, the trench filler material filled in the trenches within the second area is covered by a photo resist layer, and removing the trench filler material includes performing an etch process on the photo resist layer and the trench filler material such that the entire trench filler material filled in the trenches within the first area is etched away and the trench filler material in the trenches within the second area still exists.

10. The method of claim 9, wherein the etch process is a dry etch process.

11. The method of claim 6, further comprising removing the trench filler material filled in the trenches within the second area.

12. The method of claim 11, wherein removing the trench filler material filled in the trenches within the second area is performed prior to removing the sacrificial layers of the stack within the first area.

13. The method of claim 11, wherein removing the trench filler material filled in the trenches within the second area is performed after the sacrificial layers of the stack within the first area are removed.

14. The method of claim 1, further comprising:
forming one or more channel structures through the insulating layers and the sacrificial layers of the stack within the core area into the substrate.

15. The method of claim 14, wherein the one or more channel structures are formed prior to forming the trenches.

16. The method of claim 1, further comprising: prior to forming the liner, performing an oxidization process on the uncovered substrate to form an oxidation layer.

17. The method of claim 1, wherein the liner is etch resistant to an etchant that is used to remove the sacrificial layers.

18. The method of claim 17, wherein the etchant includes sulfuric acid (H2S04).

19. The method of claim 17, wherein the etchant includes tetramethyl ammonium hydroxide (TMAH).

20. The method of claim 1, wherein the liner includes polysilicon.

* * * * *